US010742919B2

(12) United States Patent
Tanaka et al.

(10) Patent No.: US 10,742,919 B2
(45) Date of Patent: Aug. 11, 2020

(54) IMAGE SENSOR AND ELECTRONIC DEVICE

(71) Applicant: SONY SEMICONDUCTOR SOLUTIONS CORPORATION, Kanagawa (JP)

(72) Inventors: Terukazu Tanaka, Tokyo (JP); Masaki Sakakibara, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/323,674

(22) PCT Filed: Aug. 17, 2017

(86) PCT No.: PCT/JP2017/029495
§ 371 (c)(1),
(2) Date: Feb. 6, 2019

(87) PCT Pub. No.: WO2018/043141
PCT Pub. Date: Mar. 8, 2018

(65) Prior Publication Data
US 2019/0208152 A1    Jul. 4, 2019

(30) Foreign Application Priority Data
Aug. 30, 2016    (JP) ................................ 2016-167592

(51) Int. Cl.
*H04N 5/374*        (2011.01)
*H04N 5/3745*       (2011.01)
(Continued)

(52) U.S. Cl.
CPC .......... *H04N 5/37455* (2013.01); *H03M 1/56* (2013.01); *H04N 5/378* (2013.01)

(58) Field of Classification Search
CPC ................................................ H04N 5/37455
(Continued)

(56) References Cited

U.S. PATENT DOCUMENTS

2008/0211951 A1*  9/2008  Wakabayashi ....... H04N 5/3655
                                                        348/308
2011/0062310 A1   3/2011  Kudo
(Continued)

FOREIGN PATENT DOCUMENTS

JP    2008-219243 A    9/2008
JP    2009-290658 A    12/2009
(Continued)

OTHER PUBLICATIONS

International Search Report and Written Opinion of PCT Application No. PCT/JP2017/029495, dated Nov. 7, 2017, 09 pages of ISRWO.

*Primary Examiner* — Joel W Fosselman
(74) *Attorney, Agent, or Firm* — Chip Law Group

(57) ABSTRACT

The present technology relates to an image sensor capable of suppressing the power consumption, and an electronic device. A reference signal output unit outputs a reference signal of which a level is changed and includes a plurality of DACs and a load resistance for outputting the reference signal. The plurality of DACs includes a plurality of current sources and a plurality of switches controlling a current flowing from the current source. The reference signal output unit is connected to three or more power sources, and in combinations of two power sources in the three or more power sources, each of two or more types of combinations of the power sources includes a first path through which the current controlled by the switch flows, and a second path through which a current in the same direction flows to the load resistance.

7 Claims, 16 Drawing Sheets

(51) Int. Cl.
*H04N 5/378* (2011.01)
*H03M 1/56* (2006.01)
(58) Field of Classification Search
USPC .......................................... 348/308
See application file for complete search history.

(56) References Cited

U.S. PATENT DOCUMENTS

2011/0279723 A1* 11/2011 Takamiya ........... H03M 1/0612
                                                                                            348/308
2012/0119063 A1    5/2012 Takamiya et al.

FOREIGN PATENT DOCUMENTS

| | | |
|---|---|---|
| JP | 2011-259407 A | 12/2011 |
| JP | 2012-109658 A | 6/2012 |
| JP | 2015-053708 A | 3/2015 |

* cited by examiner

IMAGE SENSOR AND ELECTRONIC DEVICE

CROSS REFERENCE TO RELATED APPLICATIONS

This application is a U.S. National Phase of International Patent Application No. PCT/JP2017/029495 filed on Aug. 17, 2017, which claims priority benefit of Japanese Patent Application No. JP 2016-167592 filed in the Japan Patent Office on Aug. 30, 2016. Each of the above-referenced applications is hereby incorporated herein by reference in its entirety.

TECHNICAL FIELD

The present technology relates to an image sensor and an electronic device, and in particular, for example, relates to an image sensor capable of suppressing the power consumption, and an electronic device.

BACKGROUND ART

Recently, in a digital (still/video) camera and other electronic devices, for example, a complementary metal oxide semiconductor (CMOS) image sensor is used as a solid imaging device capturing an image.

In the CMOS image sensor, for example, in an analog to digital converter (ADC), an electric signal obtained from a pixel, is compared with a reference signal of which a level is changed, and analog to digital (AD) conversion of the electric signal obtained from the pixel, is performed by using a comparison result between the electric signal and the reference signal.

As described above, the AD conversion performed by using the comparison result with respect to the reference signal, is referred to as reference signal comparison type AD conversion. In the reference signal comparison type AD conversion, the reference signal is used, and thus, a digital to analog converter (DAC) generating the reference signal, is required. For example, a current output type DAC is used as the DAC generating the reference signal (for example, refer to Patent Document 1).

CITATION LIST

Patent Document

Patent Document 1: Japanese Patent Application Laid-Open No. 2015-053708

SUMMARY OF THE INVENTION

Problems to be Solved by the Invention

In a case where a range of a voltage to be output as the reference signal, is a range of a positive voltage, a power source of a positive voltage (a positive power source) and a ground (GND) are connected to the DAC, and thus, it is possible to generate the reference signal in the range of the positive voltage.

In addition, in a case where the range of the voltage to be output as the reference signal extends from the positive voltage to the negative voltage, the positive power source, and a power source of the negative voltage (a negative power source) are connected to the DAC, and thus, it is possible to generate the reference signal in the range from the positive voltage to the negative voltage.

However, in a case where the positive power source and the negative power source are connected to one DAC, a current constantly flows from the positive power source towards the negative power source, and thus, the power consumption greatly increases, compared to a case where the positive power source and the GND are connected to the DAC.

The present technology has been made in consideration of such circumstances described above, and an object thereof is to enable the power consumption to be suppressed.

Solutions to Problems

An image sensor of the present technology includes: a pixel configured to output an electric signal, by including a photoelectric conversion element performing photoelectric conversion; a reference signal output unit configured to output a reference signal of which a level is changed; and an analog to digital (AD) conversion unit configured to perform AD conversion of the electric signal by comparing the electric signal output from the pixel, with the reference signal, and by using a comparison result between the electric signal and the reference signal, in which the reference signal output unit includes, a plurality of DACs including a plurality of current sources, and a plurality of switches controlling a current flowing from the current source, and a load resistance configured to output the reference signal according to the flow of the current, the reference signal output unit is connected to three or more power sources, and in combinations of two power sources in the three or more power sources, each of two or more types of combinations of the power sources includes a first path through which the current controlled by the switch, flows, and a second path through which a current in the same direction, flows to the load resistance.

An electronic device of the present technology includes: an optical system configured to condense light; and an image sensor configured to receive light, and to output a signal corresponding to an amount of the received light, in which the image sensor includes, a pixel configured to output an electric signal, by including a photoelectric conversion element performing photoelectric conversion, a reference signal output unit configured to output a reference signal of which a level is changed, and an analog to digital (AD) conversion unit configured to perform AD conversion of the electric signal by comparing the electric signal output from the pixel, with the reference signal, and by using a comparison result between the electric signal and the reference signal, the reference signal output unit includes, a plurality of DACs including a plurality of current sources, and a plurality of switches controlling a current flowing from the current source, and a load resistance configured to output the reference signal according to the flow of the current, the reference signal output unit is connected to three or more power sources, and in combinations of two power sources in the three or more power sources, each of two or more types of combinations of the power sources includes a first path through which the current controlled by the switch, flows, and a second path through which a current in the same direction, flows to the load resistance.

In the image sensor and the electronic device of the present technology, the AD conversion of the electric signal is performed by using the comparison result obtained by comparing the electric signal with the reference signal. In the reference signal output unit outputting the reference signal, in the plurality of DACs, the currents flowing from the plurality of current sources are controlled by the plurality of switches, and the currents flow to the load resistance, and thus, the reference signal is output. The reference signal output unit is connected to the three or more power sources, and in the combinations of the two power sources in the three or more power sources, the first path through which the current controlled by the switch, flows, and the second path through which the current in the same direction, flows to the load resistance, exist in each of two or more types of combinations of the power sources.

Furthermore, the image sensor may be an independent device, and may be an internal block configuring one device.

Effects of the Invention

According to the present technology, it is possible to suppress the power consumption.

Furthermore, the effects described here are not necessarily limited, and may be any of the effects described in the present disclosure.

MODE FOR CARRYING OUT THE INVENTION

<One Embodiment of Digital Camera to which Present Technology is Applied>

Figure 1:
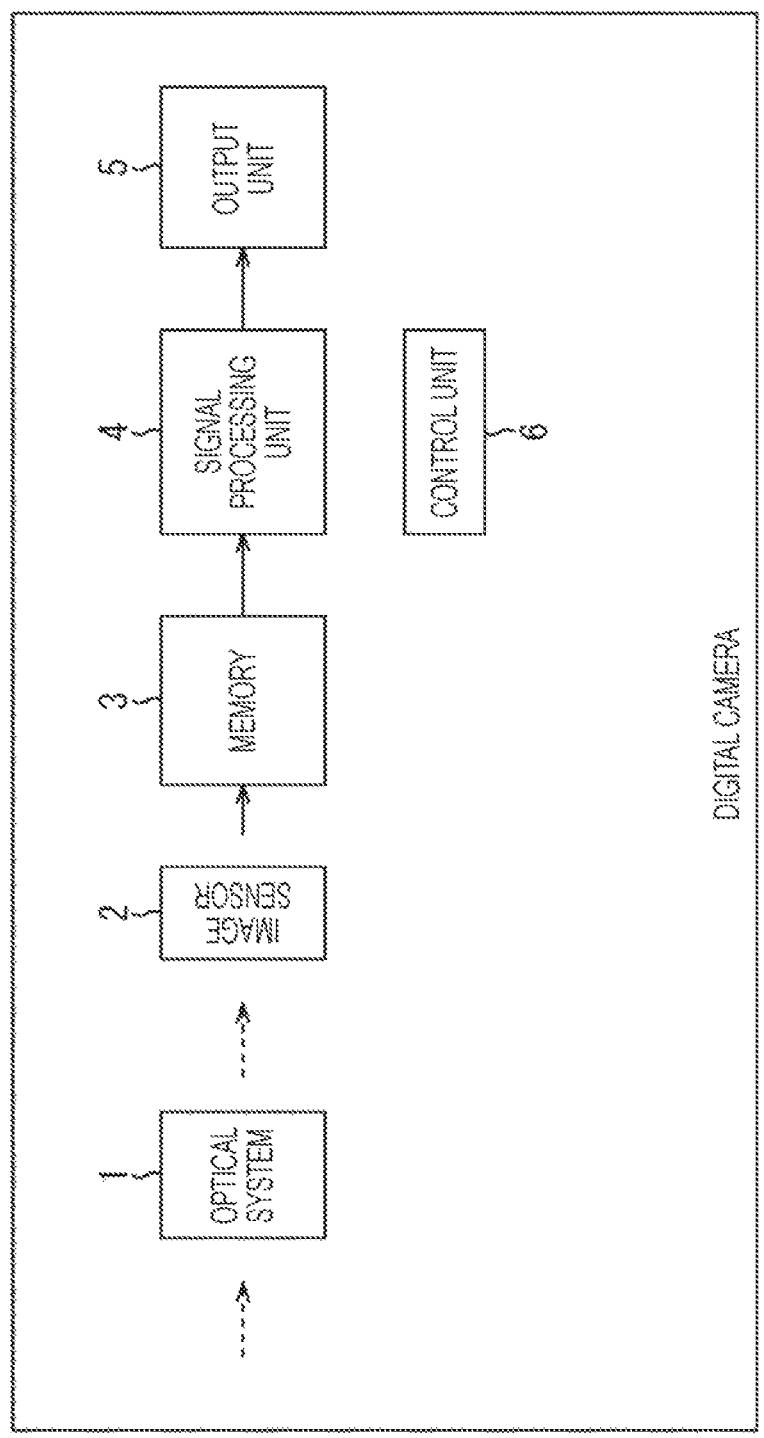
FIG. 1 is a block diagram illustrating a configuration example of one embodiment of a digital camera to which the present technology is applied.

FIG. 1 is a block diagram illustrating a configuration example of one embodiment of a digital camera to which the present technology is applied.

Furthermore, the digital camera is capable of capturing both of a still image and a moving image.

In FIG. 1, the digital camera includes an optical system 1, an image sensor 2, a memory 3, a signal processing unit 4, an output unit 5, and a control unit 6.

The optical system 1, for example, includes a zoom lens, a focus lens, a diaphragm, or the like, which is not illustrated, and allows light from the outside, to be incident on the image sensor 2.

The image sensor 2, for example, is a complementary metal oxide semiconductor (CMOS) image sensor, receives the incident light from the optical system 1, performs photoelectric conversion, and outputs image data corresponding to the incident light from the optical system 1.

The memory 3 temporarily stores the image data output from the image sensor 2.

The signal processing unit 4, for example, performs processing such as the removal of a noise and the adjustment of a white balance, as signal processing using the image data stored in the memory 3, and supplies the processed image data to the output unit 5.

The output unit 5 outputs the image data from the signal processing unit 4.

That is, the output unit 5, for example, includes a display (not illustrated) including liquid crystals or the like, and displays an image corresponding to the image data from the signal processing unit 4, as a so-called through image.

In addition, the output unit 5, for example, includes a semiconductor memory, and a driver (not illustrated) driving a recording medium such as a magnetic disk and an optical disk, and records the image data from the signal processing unit 4, in the recording medium.

The control unit 6 controls each block configuring the digital camera, according to a manipulation of a user, or the like.

In the digital camera configured as described above, the image sensor 2 receives the incident light from the optical system 1, and outputs the image data, according to the incident light.

The image data output from the image sensor 2, is supplied to the memory 3 to be stored. The image data stored in the memory 3, is subjected to the signal processing of the signal processing unit 4, and the image data obtained as a result thereof, is supplied to the output unit 5 to be output.

<Configuration Example of Image Sensor 2>

Figure 2:
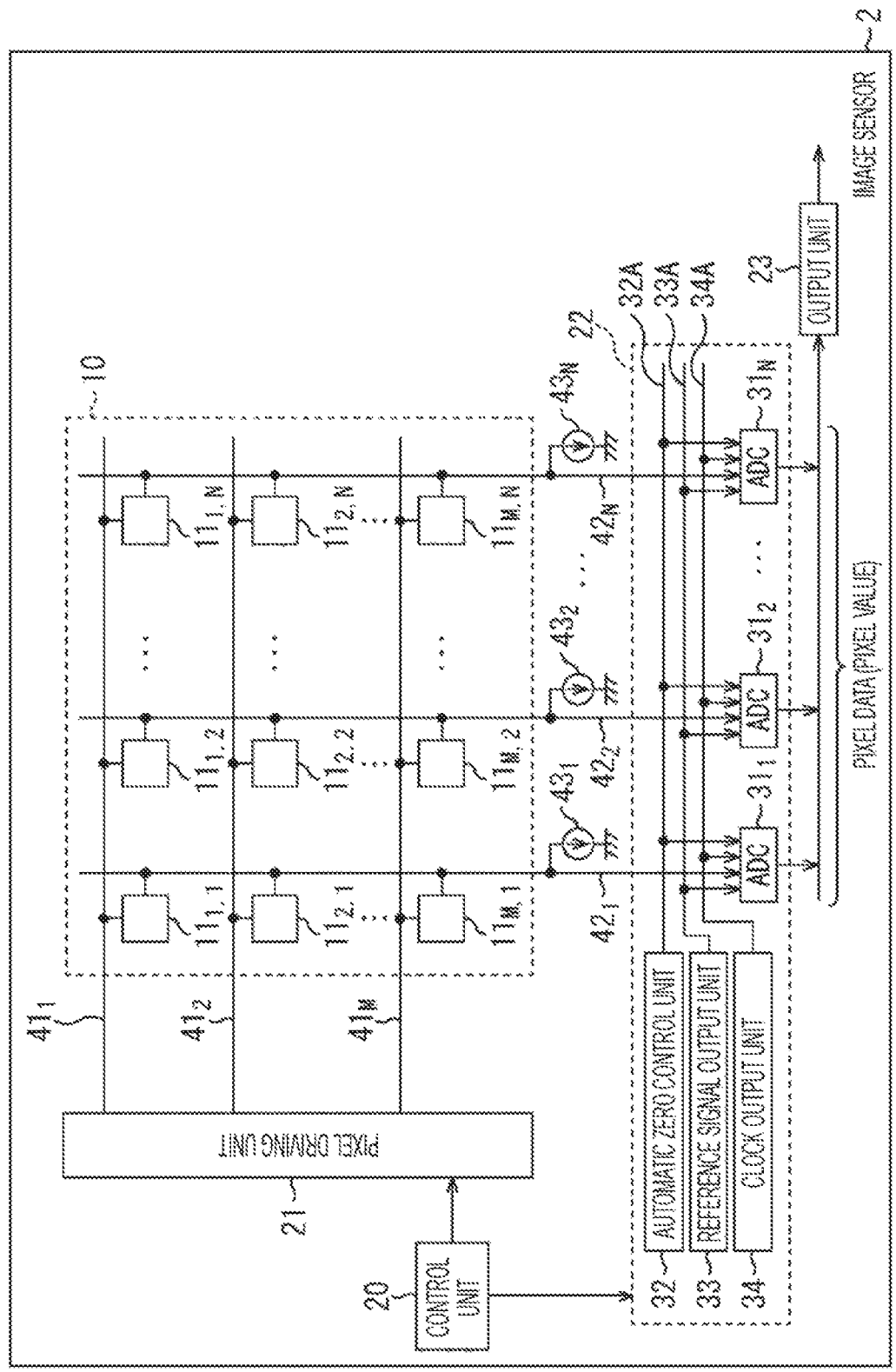
FIG. 2 is a block diagram illustrating a configuration example of an image sensor 2.

FIG. 2 is a block diagram illustrating a configuration example of the image sensor 2 of FIG. 1.

In FIG. 2, the image sensor 2 includes a pixel array 10, a control unit 20, a pixel driving unit 21, a column parallel AD conversion device 22, and an output unit 23.

The pixel array 10 includes M×N (M and N are an integer of greater than or equal to 1) pixels $11_{1,1}, 11_{1,2}, \ldots, 11_{1,N}, 11_{2,1}, 11_{2,2}, \ldots, 11_{2,N}, \ldots, 11_{M,1}, 11_{M,2}, \ldots,$ and $11_{M,N}$, performing the photoelectric conversion, and functions as an imaging unit (an imaging element) capturing an image.

The M×N pixels $11_{1,1}$ to $11_{M,N}$ are arranged on a two-dimensional surface into the shape of an M-by-N matrix (a lattice).

In the pixel array 10, a pixel control line $41_m$ extending in a row direction (a horizontal direction) is connected to N pixels $11_{m,1}$ to $11_{m,N}$ arranged in the row direction of the m-th row (m=1, 2, . . . , M) (from the top).

In addition, a vertical signal line (VSL) $42_n$ extending in a column direction (a vertical direction) is connected to M pixels $11_{1,n}$ to $11_{m,N}$ in the column direction of the n-th column (n=1, 2, . . . , N) (from the left). A current source $43_n$ is connected to the VSL $42_n$, in addition to the pixels $11_{1,n}$ to $11_{M,n}$.

The pixel $11_{m,n}$ performs the photoelectric conversion of the light incident thereon (the incident light). Further, the pixel $11_{m,n}$ outputs a voltage (an electric signal) corresponding to a charge to be obtained by the photoelectric conversion, onto the VSL $42_n$, according to the control from the pixel driving unit 21 through the pixel control line $41_m$.

Furthermore, the pixel $11_{m,n}$, for example, is capable of performing the photoelectric conversion of light of a predetermined color, to be incident through a color filter (not illustrated) such as a Bayer array.

The control unit 20 controls the pixel driving unit 21, the column parallel AD conversion device 22 (the automatic zero control unit 32, the reference signal output unit 33, or the like, configuring the column parallel AD conversion device 22), and other necessary blocks, according to a predetermined logic or the like.

The pixel driving unit 21 controls (drives) the pixels $11_{m,1}$ to $11_{m,N}$ connected to the pixel control line $41_m$, according to the control of the control unit 20, through the pixel control line $41_m$.

The column parallel AD conversion device 22 is connected to each of the pixels $11_{m,1}$ to $11_{m,N}$ arranged in each of the rows, through VSLs $42_1$ to $42_N$, and thus, an electric signal (a voltage) to be output onto the VSL $42_n$ by the pixel $11_{m,n}$ (hereinafter, also referred to as a VSL signal), is supplied to the column parallel AD conversion device 22.

The column parallel AD conversion device 22 is a column parallel AD conversion device performing the AD conversion of the VSL signal supplied from each of the pixels $11_{m,1}$ to $11_{m,N}$ arranged in one row, through the VSLs $42_1$ to $42_N$, in parallel, and supplies digital data obtained as a result of the AD conversion, to the output unit 23, as a pixel value (pixel data) of the pixels $11_{m,1}$ to $11_{m,N}$.

Here, the column parallel AD conversion device 22 is capable of performing not only the AD conversion of the electric signals of all of the N pixels $11_{m,1}$ to $11_{m,N}$ arranged in one row, in parallel, but also the AD conversion of the electric signals of the pixels of greater than 1 and less than N, in N pixels $11_{m,1}$ to $11_{m,N}$, in parallel.

However, hereinafter, for the sake of simple description, the column parallel AD conversion device 22 performs the AD conversion of the VSL signals of all of the N pixels $11_{m,1}$ to $11_{m,N}$ arranged in one row, in parallel.

The column parallel AD conversion device 22 includes N analog to digital converters (ADCs) $31_1$ to $31_N$, in order to perform the AD conversion of the VSL signals of all of the N pixels $11_{m,1}$ to $11_{m,N}$ arranged in one row, in parallel.

Further, the column parallel AD conversion device 22 includes an automatic zero control unit 32, a reference signal output unit 33, and a clock output unit 34.

The automatic zero control unit 32 supplies (outputs) an automatic zero pulse (an AZ pulse) which is a signal for controlling automatic zero processing of a comparator (not illustrated) of the ADC $31_n$, to the ADCs $31_1$ to $31_N$, through an automatic zero control line 32A. In the automatic zero processing, a direct current (DC) level of an inverting input terminal and a non-inverting input terminal of the comparator of the ADC $31_n$, is adjusted.

The reference signal output unit 33, for example, includes a digital to analog converter (DAC), and supplies (outputs) a reference signal having a period in which a level (a voltage) is changed from a predetermined initial value to a predetermined final value, to the ADCs $31_1$ to $31_N$, through a reference signal line 33A, at a constant inclination, such as a ramp signal.

Furthermore, in this embodiment, for example, a signal having a slope in which the level (the voltage) decreases at a constant change rate, is adopted as the reference signal. However, for example, a signal having a slope in which the level increases at a constant change rate, a signal having a section in which the level monotonically decreases or monotonically increases, in a non-linear manner, and the like can also be adopted as the reference signal.

The clock output unit 34 supplies (outputs) a clock of a predetermined frequency, to the ADCs $31_1$ to $31_N$, through a clock line 34A.

The ADC $31_n$ is connected to a VSL $41_n$, and thus, a VSL signal (an electric signal) output onto the VSL $41_n$ by the pixel $11_{m,n}$, is supplied to the ADC $31_n$.

The ADC $31_n$ performs the AD conversion of the VSL signal output by the pixel $11_{m,n}$, by using the reference signal from the reference signal output unit 33 and the clock from the clock output unit 34, and, performs correlated double sampling (CDS), and thus, obtains digital data as a pixel value.

Here, the ADC $31_n$ compares the VSL signal of the pixel $11_{m,n}$ with the reference signal from the reference signal output unit 33 in the comparator (not illustrated), and counts a time required for changing the level of the reference signal until the level of the VSL signal of the pixel $11_{m,n}$ is coincident with the level of the reference signal (until a magnitude relationship between the VSL signal and the reference signal is reversed), and thus, performs the AD conversion of the VSL signal of the pixel $11_{m,n}$.

In the ADC $31_n$, the time required for changing the level of the reference signal until the level of the VSL signal of the pixel $11_{m,n}$ is coincident with the level of the reference signal, is counted by counting the clock from the clock output unit 34.

In addition, in N ADCs $31_1$ to $31_N$, the VSL signals of the N pixels $11_{m,1}$ to $11_{m,N}$ in each row of the first row to the M-th row of the pixel array 10, for example, are sequentially supplied from the first row, and the AD conversion of the VSL signal and the CDS, are performed in row unit.

The output unit 23 selects a column n from which a pixel value is read out, reads out a result of the AD conversion (and the CDS) of the pixel $11_{m,n}$, obtained by the ADC $31_n$, from the ADC $31_n$ of the column n, as the pixel value, and outputs the result to the outside (in this embodiment, the memory 3 (FIG. 1)).

Furthermore, here, in the ADC $31_n$, the CDS is performed in addition to the AD conversion, but only the AD conversion can be performed by the ADC $31_n$, and the CDS can be performed by the output unit 23.

<Outline of Reference Signal Output Unit 33>

Figure 3:
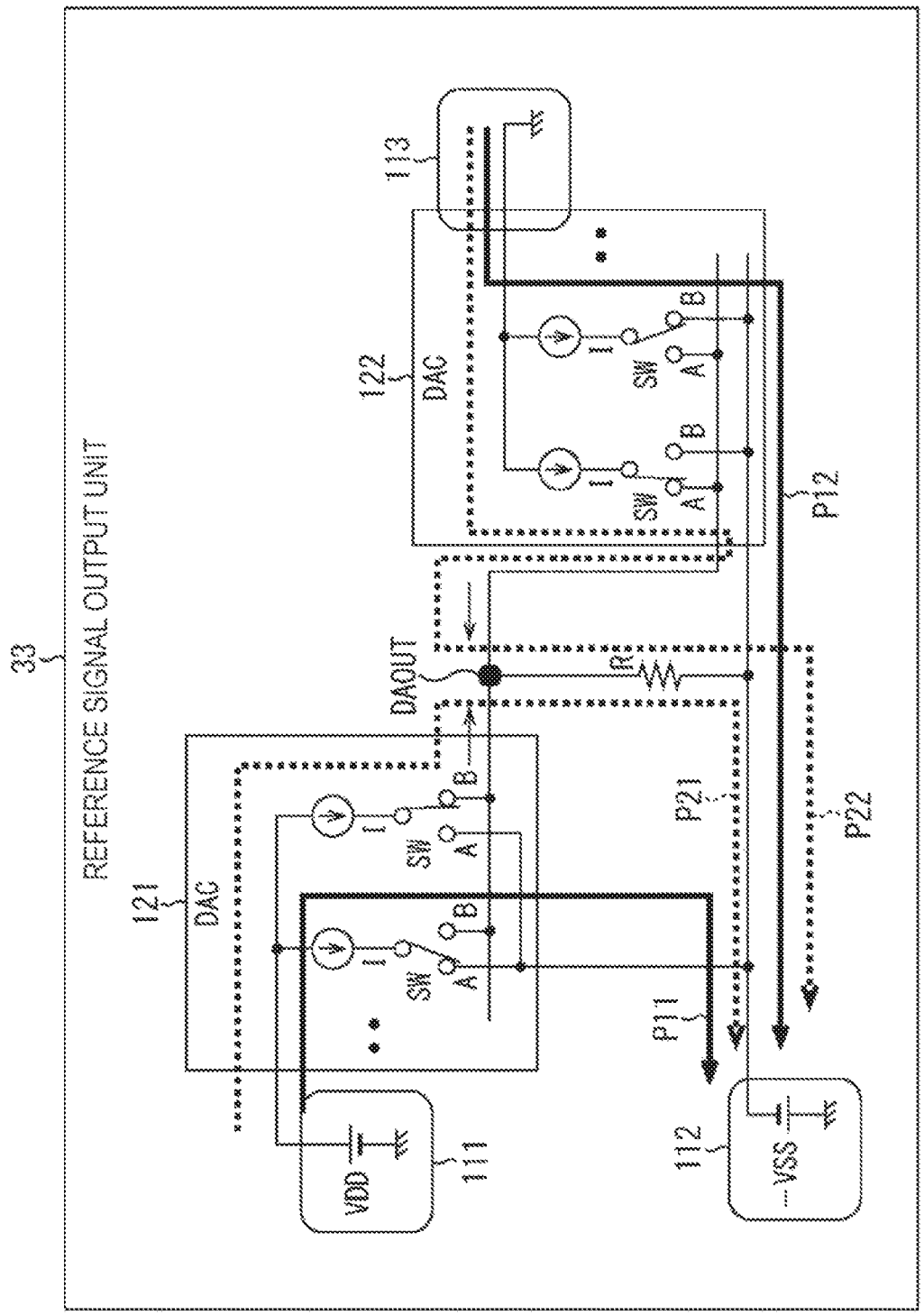
FIG. 3 is a circuit diagram illustrating the outline of a configuration example of a reference signal output unit 33.

FIG. 3 is a circuit diagram illustrating the outline of a configuration example of the reference signal output unit 33.

The reference signal output unit 33, for example, includes two DACs 121 and 122 as a plurality of DACs, and a load resistance R outputting the reference signal according to the flow of the current.

Each of the DACs 121 and 122 includes a plurality of current sources I, and a plurality of switches SW of the same number as the number of current sources I, the switches SW controlling a current I flowing from each of the current sources I. In each of the DACs 121 and 122, the number of current sources I may be the same, or may be different.

The current source I allows the current I to flow. Furthermore, On/Off of the current source I, for example, is controlled according to the control of the control unit 20 (FIG. 2). In addition, in this embodiment, each of the current sources I allows the currents I of the same value to flow, but the currents flowing from each of the current sources I, for example, may have different values such as $2^0 \times I$, $2^1 \times I$, $2^2 \times I$, ..., $2^n \times I$, ....

The switch SW is connected to the current source I, and controls the current I flowing from the current source I. Furthermore, in FIG. 3, the switch SW selects a terminal A on the left side or a terminal B on the right side, and controls the current I flowing from the current source I connected to the switch SW. That is, in a case where the switch SW selects the terminal A, the current I flowing from the current source I, flows to the terminal A, and in a case where the switch SW selects the terminal B, the current I flowing from the current source I, flows to the terminal B.

The reference signal output unit 33, for example, is connected to three power sources 111, 112, and 113, as three or more power sources.

Here, in FIG. 3, the power source 111 is a positive power source of a positive voltage VDD (VDD>0), and the power source 112 is a negative power source of a negative voltage −VSS (VSS>0). In addition, the power source 113 is a GND.

In this embodiment, the GND is regarded as a power source of which a voltage is 0 V, and is included in the power source.

Furthermore, the GND may not be included in the three or more power sources connected to the reference signal output unit 33. That is, for example, only the positive power source, only the negative power source, or only the positive power source and the negative power source can be adopted as the three or more power sources. Similarly, in the three or more power sources, the positive power source or the negative power source may not be included. That is, for example, only the positive power source and the GND, only the negative power source and the GND, or the like, can be adopted as the three or more power sources.

In addition, in this embodiment, it is illustrated that the three power sources 111 to 113 as the three or more power sources connected to the reference signal output unit 33, are provided in the reference signal output unit 33, but the three or more power sources can be provided outside the reference signal output unit 33.

In combinations of two power sources in the three or more power sources connected to the reference signal output unit 33, each of two or more types of combinations of the power sources includes a first path through which the current controlled by the switch SW of the DAC 121 or 122, flows, and a second path through which a current in the same direction, flows to the load resistance R.

In FIG. 3, the combinations of the two power sources in the three power sources 111 to 113 connected to the reference signal output unit 33, includes three types of combinations of a combination of the power source 111 and the power source 112, a combination of the power source 111 and the power source 113, and a combination of the power source 112 and the power source 113.

In the combinations of the two power sources in the three power sources 111 to 113, the combination of the power source 111 and the power source 112, includes paths P11 and P21 as the first path through which the current controlled by the switch SW of the DAC 121, flows. The path P11 is a path extending from the power source 111 to the power source 112 through the DAC 121, and the path P21 is a path extending from the power source 111 to the power source 112 through the DAC 121 and the load resistance R.

Further, the combination of the power source 111 and the power source 112, includes a path P21 as the second path through which the current in the same direction (in FIG. 3, a direction from the upper end side towards the lower end side of the load resistance R), flows to the load resistance R.

Therefore, in the combination of the power source 111 and the power source 112, the path P21 may be the first path, or may be the second path.

In addition, in the combinations of the two power sources in the three power sources 111 to 113, the combination of the power source 112 and the power source 113, includes paths P12 and P22 as the first path through which the current controlled by the switch SW of the DAC 122, flows. The path P12 is a path extending from the power source 113 to the power source 112 through the DAC 122, and the path P22 is a path extending from the power source 113 to the power source 112 through the DAC 122 and the load resistance R.

Further, the combination of the power source 112 and the power source 113, includes a path P22 as the second path through which the current in the same direction, flows to the load resistance R.

Therefore, in the combination of the power source 112 and the power source 113, the path P22 may be the first path, or may be the second path.

Here, in FIG. 3, the path which is the second path (the path P21 or P22) exists separately from the path which is the first path (path P11 or P12), but it is not necessary that the path which is the first path, and the path which is the second path, exist as different paths. That is, the path which is the first path, and the path which is the second path, may be coincident with each other.

As described above, the reference signal output unit 33 of FIG. 3 includes two types of combinations of a combination of the power source 111 and the power source 112, and a combination of the power source 112 and the power source 113, as the combination of the power sources, including the first path and the second path.

That is, in the reference signal output unit 33 of FIG. 3, the power source 111 is connected to one end of each of the current sources I of the DAC 121. In the DAC 121, the other end of the current source I is connected to the switch SW. Further, in the DAC 121, the terminal A of the switch SW is connected to the power source 112 and a lower end which is one end of the load resistance R, and the terminal B of the switch SW is connected to an upper end which is the other end of the load resistance R.

In addition, the power source 113 is connected to one end of each of the current sources I of the DAC 122. In the DAC 122, the other end of the current source I is connected to the switch SW. Further, in the DAC 122, the terminal A of the switch SW is connected to the upper end of the load resistance R, and the terminal B of the switch SW is connected to the power source 112 and the lower end of the load resistance R.

In the reference signal output unit 33 configured as described above, the current flowing from the current source I of the DAC 121, flows to the power source 112 from the power source 111, through the terminal A of the switch SW of the DAC 121, or through the terminal B of the switch SW of the DAC 121, and the load resistance R.

Therefore, in a case where the DAC 121 includes N current sources I, a constant current of the current I×N, flows to the power source 112 from the power source 111, regardless of the selection of the terminal A or B according to the switch SW of the DAC 121.

As a result thereof, in consideration of only the DAC 121, in the reference signal output unit 33, the constant current I×N flows regardless of the selection of the terminal A or B according to the switch SW of the DAC 121, and thus, it is possible to prevent an error from occurring in the AD conversion of the ADC $31_n$ due to a fluctuation in the current flowing to the reference signal output unit 33.

In the reference signal output unit 33, the current flowing from the current source I of the DAC 122, flows to the power source 112 from the power source 113, through the terminal B of the switch SW of the DAC 122, or the terminal A of the switch SW of the DAC 122, and the load resistance R.

Therefore, in a case where the DAC 122 includes the N current sources I, a constant current of the current I×N, flows to the power source 112 from the power source 113, regardless of the selection of the terminal A or B according to the switch SW of the DAC 122.

As a result thereof, in consideration of only the DAC 122, in the reference signal output unit 33, the constant current I×N flows regardless of the selection of the terminal A or B according to the switch SW of the DAC 122, and thus, it is possible to prevent an error from occurring in the AD conversion of the ADC $31_n$ due to a fluctuation in the current flowing to the reference signal output unit 33.

In FIG. 3, a current of greater than or equal to 0 flows to the load resistance R, and thus, a voltage DAOUT of the upper end of the load resistance R, is output as a reference signal DAOUT.

In FIG. 3, the voltage DAOUT increases as the current flowing to the load resistance R increases.

For example, focusing on the DAC 121, in the DAC 121, when all of the switches SW select the terminal B, the current flowing to the load resistance R is maximized, and the voltage DAOUT is maximized. Then, in the DAC 121, the voltage DAOUT decreases as the number of switches SW selecting the terminal A increases, and when all of the switches SW select the terminal A, the current flowing to the load resistance R is 0, and the voltage DAOUT is minimized.

Therefore, for example, in the DAC 121, the number of switches SW selecting the terminal A from the terminal B increases, and thus, it is possible to generate the reference signal DAOUT having a slope in which the level decreases at a constant change rate.

In addition, the reference signal output unit 33 of FIG. 3, is connected to the power source 111 of the positive voltage VDD and the power source 112 of the negative voltage −VSS, and thus, theoretically (ideally), it is possible to generate the reference signal DAOUT of a voltage in a range from the positive voltage VDD to the negative voltage −VSS.

Hereinafter, in all of the configuration examples of the reference signal output unit 33 to be described, as illustrated in FIG. 3, the reference signal output unit 33 includes the plurality of DACs including the plurality of current sources, and the plurality of switches controlling the current flowing from the current source, and the load resistance outputting the reference signal according to the flow of the current, and is connected to the three or more power sources, and in the combinations of the two power sources in the three or more power sources, each of two or more types of combinations of the power sources, includes the first path through which the current controlled by the switch, flows, and the second path through which the current in the same direction, flows to the load resistance.

<First Configuration Example of Reference Signal Output Unit 33>

Figure 4:
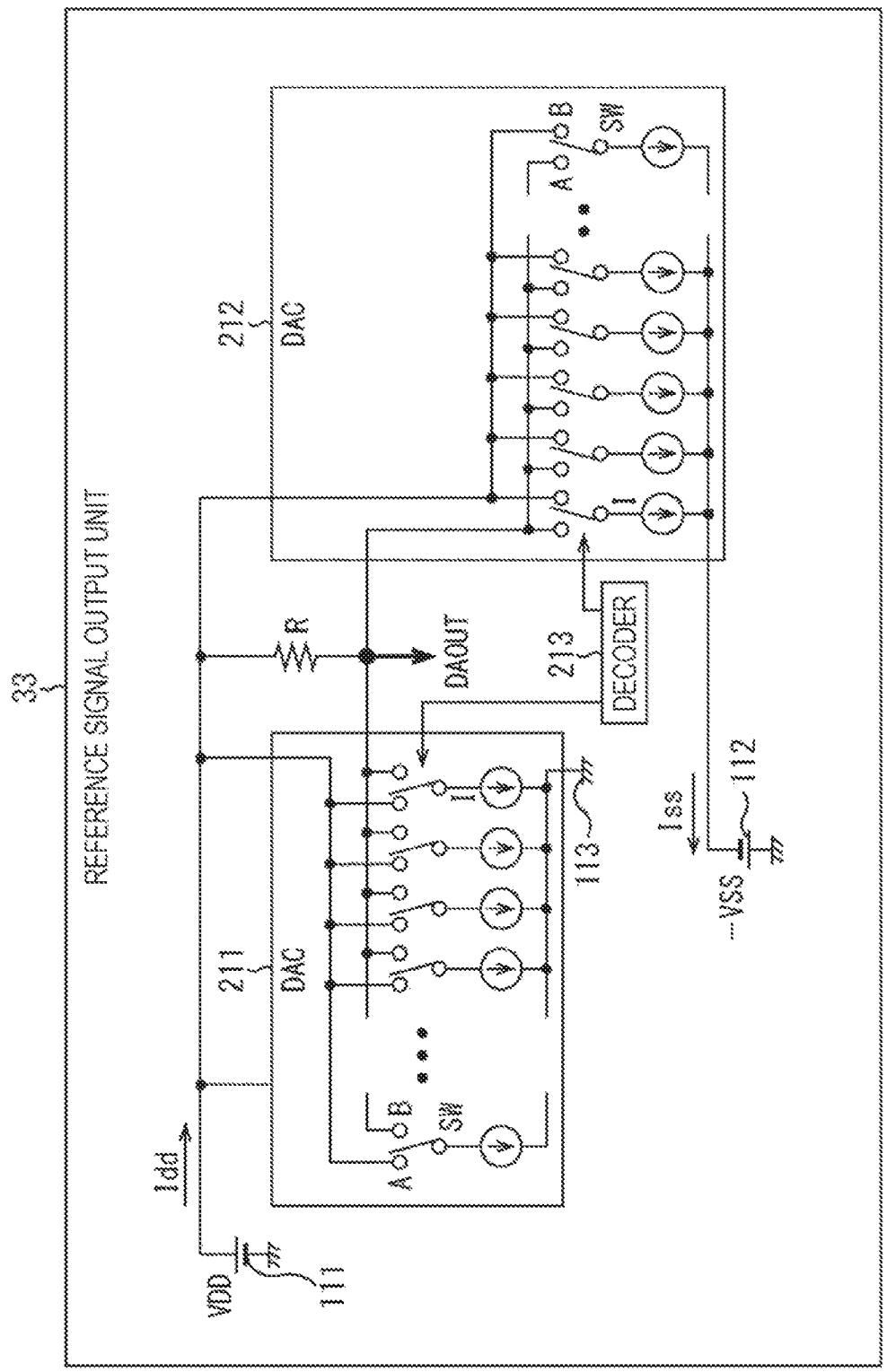
FIG. 4 is a circuit diagram illustrating a first configuration example of the reference signal output unit 33.

FIG. 4 is a circuit diagram illustrating a first configuration example of the reference signal output unit 33.

Furthermore, in the drawing, the same reference numerals will be applied to portions corresponding to those of FIG. 3, and hereinafter, the description thereof will be suitably omitted.

In FIG. 4, the reference signal output unit 33 includes DACs 211 and 212, a decoder 213, and the load resistance R.

In addition, in FIG. 4, the reference signal output unit 33 is connected to the power source 111 of the positive voltage VDD, the power source 112 of the negative voltage −VSS, and the power source 113 which is the GND. That is, the DAC 211 is connected to the power sources 111 and 113, and the DAC 212 is connected to the power sources 111 and 112.

Each of the DACs 211 and 212 includes the plurality of current sources I, and the plurality of switches SW of the same number as the number of current sources I, the switches SW controlling the current I flowing from each of the current sources I. In each of the DACs 211 and 212, the number of current sources I may be the same, or may be different.

In the DAC 211, one end of the current source I is connected to the GND as the power source 113, and the other end of the current source I is connected to the switch SW.

In the DAC 211, the switch SW selects the left terminal A or the right terminal B, according to the control of the decoder 213, and with this arrangement, the current I flowing from the current source I connected to the switch SW, is controlled.

In the DAC 211, the terminal A is connected to the power source 111, and the terminal B is connected to the lower end of the load resistance R.

In the DAC 212, one end of the current source I is connected to the power source 112, and the other end of the current source I is connected to the switch SW.

In the DAC 212, the switch SW selects the left terminal A or the right terminal B, according to the control of the decoder 213, and with this arrangement, the current I flowing from the current source I connected to the switch SW, is controlled.

In the DAC 212, the terminal A is connected to the lower end of the load resistance R, and the terminal B is connected to the power source 111.

The decoder 213, for example, controls the selection of the terminal A or the B of the switch SW of the DACs 211 and 212, according to the control of the control unit 20 (FIG. 2). That is, the decoder 213 counts a digital value, according to the control of the control unit 20, and the switch SW of the DACs 211 and 212 selects the terminal A or B such that a (analog) current corresponding to the digital value, flows through the load resistance R.

In FIG. 4, as described above, the terminal B of the DAC 211, and the terminal A of the DAC 212 are connected to the lower end of the load resistance R. In addition, the upper end of the load resistance R is connected to the power source 111, and the voltage DAOUT of the lower end of the load resistance R, is output as the reference signal DAOUT.

Therefore, in FIG. 4, the voltage as the reference signal DAOUT, is a voltage based on the voltage VDD of the power source 111, and in a case where the current flowing to the load resistance R is represented as i, the voltage is represented by an expression of DAOUT=VDD−iR.

In the reference signal output unit 33 of FIG. 4, the combination of the power sources 111 and 113 connected to the DAC 211, includes a path extending from the power source 111 to the power source 113 through the terminal A and the current source I of the DAC 211, and a path extending from the power source 111 to the power source 113 through the load resistance R, and the terminal B and the current source I of the DAC 211, as the first path through which the current controlled by the switch SW of the DAC 211, flows.

Further, the combination of the power sources 111 and 113, includes the path extending from the power source 111 to the power source 113, through the load resistance R, and the terminal B and the current source I of the DAC 211, as the second path through which the current in the same direction (in this embodiment, a direction from the top towards the bottom), flows to the load resistance R.

In addition, the combination of the power sources 111 and 112 connected to the DAC 212, includes a path extending from the power source 111 to the power source 112 through the terminal B and the current source I of the DAC 212, and a path extending from the power source 111 to the power source 112 through the load resistance R, and the terminal A and the current source I of the DAC 212, as the first path through which the current controlled by the switch SW of the DAC 212, flows.

Further, the combination of the power sources 111 and 112, includes the path extending from the power source 111 to the power source 112 through the load resistance R, and the terminal A and the current source I of the DAC 212, as the second path through which the current in the same direction, flows to the load resistance R.

Here, the DAC 211 exists on the first path and the second path of the combination of the power sources 111 and 113 connected to the DAC 211. Similarly, the DAC 212 exists on the first path and the second path of the combination of the power sources 111 and 112 connected to the DAC 212.

In the reference signal output unit 33 configured as described above, the current flowing from the current source I of the DAC 211, flows to the power source 113 from the power source 111, through the terminal A of the switch SW of the DAC 211, or through the load resistance R, and the terminal B of the switch SW of the DAC 211.

Therefore, in a case where the DAC 211 includes the N current sources I, the DAC 211 allows a constant current of the current I×N to flow towards the power source 112 from the power source 111, regardless of the selection of the terminal A or B according to the switch SW of the DAC 211.

As a result thereof, in consideration of only the DAC 211, in the reference signal output unit 33, the constant current IX N flows regardless of the selection of the terminal A or B according to the switch SW of the DAC 211, and thus, it is possible to prevent an error from occurring in the AD conversion of the ADC $31_n$ due to a fluctuation in the current flowing to the reference signal output unit 33.

In addition, in the reference signal output unit 33, the current flowing from the current source I of the DAC 212, flows to the power source 112 from the power source 111, through the terminal B of the switch SW of the DAC 212, or through the load resistance R, and the terminal A of the switch SW of the DAC 212.

Therefore, in a case where the DAC 212 includes the N current sources I, the DAC 212 allows a constant current of the current I×N to flow towards the power source 112 from the power source 111, regardless of the selection of the terminal A or B according to the switch SW of the DAC 212.

As a result thereof, in consideration of only the DAC 212, in the reference signal output unit 33, the constant current I×N flows regardless of the selection of the terminal A or B according to the switch SW of the DAC 212, and thus, it is possible to prevent an error from occurring in the AD conversion of the ADC $31_n$ due to a fluctuation in the current flowing to the reference signal output unit 33.

Furthermore, in FIG. 4, in the current flowing from the current source I of the DAC 211, the current flowing to the power source 113 from the power source 111 through the terminal A of the switch SW of the DAC 211, is a current not contributing to the generation of the reference signal DAOUT, that is, a current to be discarded to the power source 111.

Similarly, in the current flowing from the current source I of the DAC 212, the current flowing to the power source 122 from the power source 111 through the terminal B of the switch SW of the DAC 212, is a current to be discarded to the power source 111.

As described above, in a case where the current flowing to the load resistance R, is represented as i, the reference signal DAOUT output by the reference signal output unit 33 of FIG. 4, is represented by an expression of DAOUT=VDD−iR. That is, the voltage as the reference signal DAOUT decreases as the current flowing to the load resistance R increases.

For example, focusing on the DAC 212, in the DAC 212, when all of the switches SW select the terminal B, the current flowing to the load resistance R is minimized, and the voltage as the reference signal DAOUT is maximized. In addition, in the DAC 212, the current flowing through the load resistance R increases, and the voltage as the reference signal DAOUT decreases, as the number of switches SW selecting the terminal A increases. Then, in the DAC 212, when all of the switches SW select the terminal A, the current flowing to the load resistance R is maximized, and the voltage as the reference signal DAOUT is minimized.

Therefore, for example, in the DAC 212, the number of switches SW selecting the terminal A increases, and thus, it is possible to generate the reference signal DAOUT having a slope in which the level decreases at a constant change rate.

In the reference signal output unit 33 of FIG. 4, the DAC 212 is connected to the power source 111 of the positive voltage VDD, and the power source 112 of the negative voltage −VSS, and thus, in the DACs 211 and 212, only the DAC 212 is operated, and the current flowing to the load resistance R, is controlled by the switch SW of the DAC 212, and therefore, it is possible to generate the reference signal DAOUT of a voltage in a range from a positive voltage of less than or equal to the positive voltage VDD to a negative voltage of greater than or equal to the negative voltage −VSS.

However, in a case where the reference signal DAOUT of the voltage in the range from the positive voltage to the negative voltage is generated by operating only the DAC 212, in the DAC 212, at all times (constantly), the constant current I×N described above, flows.

In a case where the current flowing from the power source 111 of the positive voltage VDD, is represented as Idd, and the current flowing to the power source 112 of the negative voltage −VSS, is represented as Iss, the currents Idd and Iss are the constant current I×N.

Then, in a case where in the reference signal DAOUT of the voltage in the range from the positive voltage to the negative voltage, is generated by operating only the DAC 212, power consumption P of the reference signal output unit 33, normally, is power represented by an expression of P=Vdd×Idd+Vss×Iss.

However, the reference signal output unit 33 of FIG. 4, includes the DAC 211 connected to the power source 111 of the positive voltage VDD, and the power source 113 which is the GND, in addition to the DAC 212 connected to the power source 111 of the positive voltage VDD, and the power source 112 of the negative voltage −VSS.

In the DAC 212 connected to the power source 111 of the positive voltage VDD, and the power source 112 of the negative voltage −VSS, as described above, it is possible to generate the reference signal DAOUT of the voltage in the range from the positive voltage of less than or equal to the positive voltage VDD, to the negative voltage of greater than or equal to negative voltage −VSS.

In addition, the current flowing from the DAC 212, flows between the power source 111 of the positive voltage VDD and the power source 112 of the negative voltage −VSS. Therefore, the power consumption of the current flowing from the DAC 212, is a product of the current and the voltage VDD+VSS.

On the other hand, in the DAC 211 connected to the power source 111 of the positive voltage VDD, and the power source 113 which is the GND, it is possible to generate the reference signal DAOUT of a voltage in a range from the positive voltage of less than or equal to the positive voltage VDD, to the voltage of the GND, that is, 0 V.

In addition, the current flowing from the DAC 211, flows between the power source 111 of the positive voltage VDD and the power source 113 which is the GND. Therefore, the power consumption of the current flowing from the DAC 211, is a product of the current and the voltage VDD.

For the sake of simple description, in a case where the current flowing from the DAC 211, is identical to the current flowing from the DAC 212, the power consumption of the current flowing from the DAC 212 is greater than the power consumption of the current flowing from the DAC 211 by the negative voltage −VSS of the power source 112 connected to the DAC 212. In other words, the power consumption of the current flowing from the DAC 211 is less than the power consumption of the current flowing from the DAC 212.

As described above, according to the DAC 212, it is possible to generate the reference signal DAOUT of the voltage in the range from the positive voltage to the negative voltage, but the power consumption increases.

On the other hand, according to the DAC 211, it is possible to generate only the reference signal DAOUT of the voltage in the range from the positive voltage to 0 V, that is, it is not possible to generate the reference signal DAOUT of the negative voltage, but the power consumption decreases.

Therefore, in the reference signal output unit 33, the DAC used for outputting the reference signal DAOUT, is changed according to the range of the voltage to be output as the reference signal DAOUT, and thus, it is possible to output the reference signal DAOUT of the voltage in the range from the positive voltage to the negative voltage, and to suppress the power consumption.

That is, in the reference signal output unit 33, for example, the reference signal DAOUT of the voltage in the range from the positive voltage to 0 V, is output by using the DAC 211 in the DACs 211 and 212. Then, the reference signal DAOUT of a voltage in a range from 0 V to the negative voltage, is output by using the DAC 212.

Figure 5:
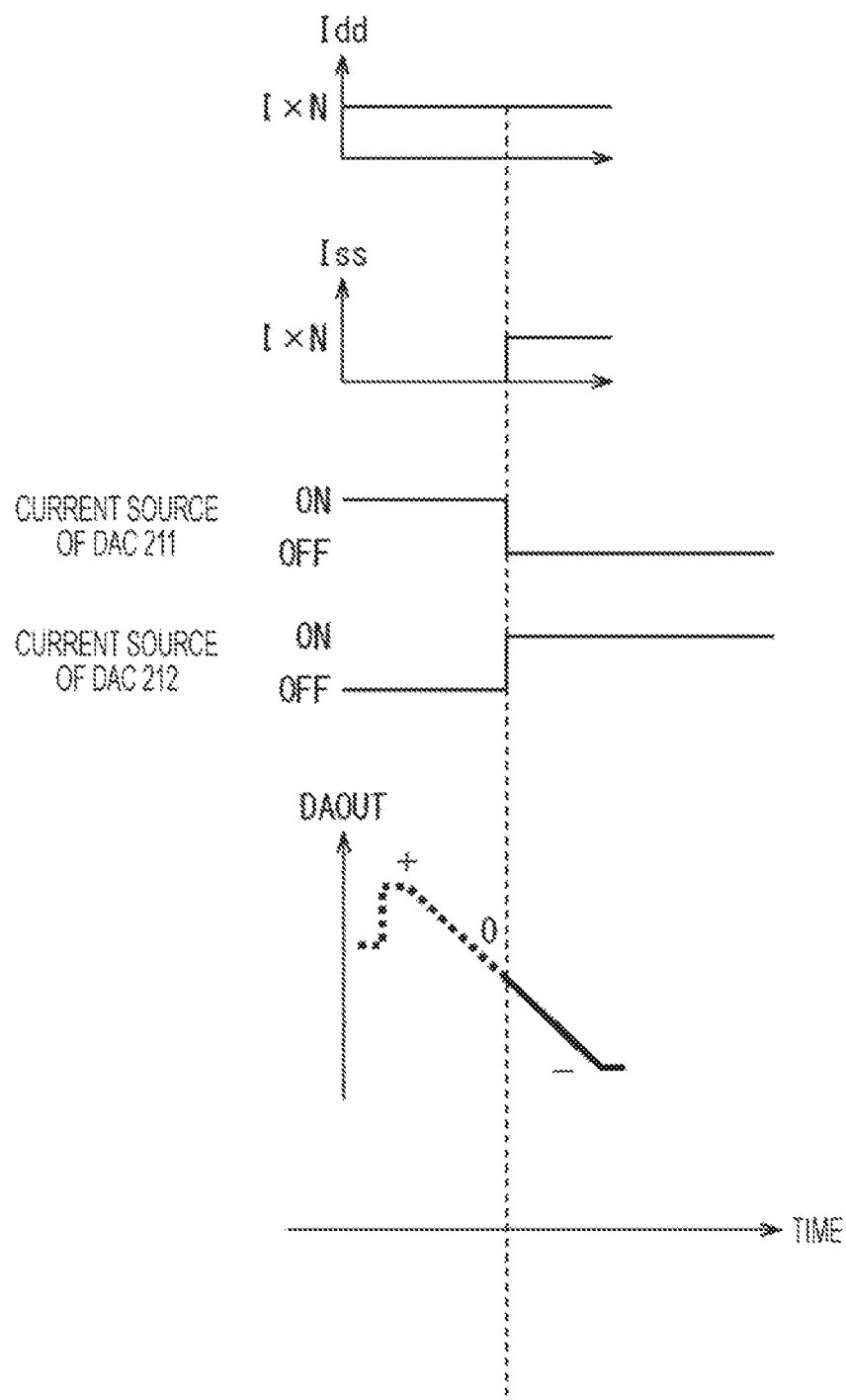
FIG. 5 is a timing chart describing an example of the operation of the first configuration example of the reference signal output unit 33.

FIG. 5 is a timing chart describing an example of the operation of the reference signal output unit 33 of FIG. 4.

That is, FIG. 5 illustrates an example of the current Idd flowing through the power source 111, the current Iss flowing through the power source 112, an On/Off state of the current source I of the DACs 211 and 212, and the reference signal DAOUT.

Furthermore, here, for the sake of simple description, both of the number of current sources I of the DAC 211, and the number of current sources I of the DAC 212 are set to N. In this case, both of the current flowing from the DAC 211, and the current flowing from the DAC 212, are a constant current of I×N.

In the output of the reference signal DAOUT which is changed from the positive voltage to the negative voltage, in order to output the reference signal DAOUT of the voltage in the range from the positive voltage to 0 V, as illustrated in FIG. 5, the current source I of the DAC 211 is controlled such that the current source I is turned on, and the current source I of the DAC 212 is controlled such that the current source I is turned off.

In the DAC 211 (of which the current source I is) turned on, the decoder 213 controls the switch SW such that the number of switches SW selecting the terminal B from the terminal A increases, and with this arrangement, the reference signal DAOUT gradually decreases, as illustrated in FIG. 5.

The current Idd flowing through the power source 111, is the constant current I×N flowing from (all of the current sources I of) the DAC 211, while the reference signal DAOUT of the positive voltage is output.

In addition, the current source I of the DAC 212 is turned off while the reference signal DAOUT of the positive voltage is output, and thus, the current flowing from the DAC 212 is 0, and the current Iss flowing to the power source 112 connected to the DAC 212, is also 0.

After that, in a case where the reference signal DAOUT is 0 V which is the minimum voltage that can be output by using the DAC 211 (and not using the DAC 212), in the subsequent output of the reference signal DAOUT of the negative voltage, as illustrated in FIG. 5, the current source I of the DAC 211 is controlled such that the current source I is turned off, and the current source I of the DAC 212 is controlled such that the current source I is turned on.

The current source I of the DAC 211 is turned off, and thus, the current does not flow to the DAC 211, but the current source I of the DAC 212 is turned on, and thus, the current flowing from the DAC 212 is changed to I×N from 0.

The current flowing from the DAC 212, is identical to the current I×N flowing from the DAC 211 before being turned off, and the current Iss flowing to the power source 112 connected to the DAC 212, is the current I×N flowing from the DAC 212, as illustrated in FIG. 5.

In addition, the current flowing from the DAC 211 is changed to 0 from I×N, and the current flowing from the DAC 212 is changed to I×N from 0, and thus, as illustrated in FIG. 5, the current Idd flowing through the power source 111 remains as I×N.

In the DAC 212 turned on, the decoder 213 controls the switch SW such that the number of switches SW selecting the terminal A from the terminal B increases, and with this arrangement, the reference signal DAOUT gradually decreases, as illustrated in FIG. 5.

As described above, the On/Off of the current source I of the DACs 211 and 212 is controlled according to the range of the voltage to be output as the reference signal DAOUT, and thus, the DAC used for outputting the reference signal DAOUT is changed, and the path of the current flowing to the load resistance R, is changed to a path through the DAC 212 from a path through the DAC 211, and in a range of DAOUT>0, the DAC 211 connected the (positive) power source 111 of the positive voltage VDD, is operated, and thus, the current flows to the load resistance R on the path through the DAC 211, and in a range of DAOUT<0, the DAC 212 connected to the (negative) power source 112 of the negative voltage −VSS, is operated, and thus, the current flows to the load resistance R on the path through the DAC 212, and therefore, it is possible to suppress the power consumption.

That is, (the current source I of) the DAC 211 is turned on, and the DAC 212 is turned off, at the time of outputting the reference signal DAOUT of the positive voltage, and the DAC 211 is turned off, and the DAC 212 is turned on, at the time of outputting the reference signal DAOUT of the negative voltage, and thus, it is possible to suppress the power consumption in order to output the reference signal DAOUT of the voltage in the range from the positive voltage to the negative voltage.

Specifically, only the DAC 212 connected to the power source 111 of the positive voltage VDD, and the power source 112 of the negative voltage −VSS, is turned on (operated), and in a case where the reference signal DAOUT of the voltage in the range from the positive voltage to the negative voltage, is output, as illustrated in FIG. 4, the power consumption P of the reference signal output unit 33, normally, is power represented by an expression of P=Vdd×Idd+Vss×Iss.

On the other hand, in a case where the DAC 211 is turned on, and the DAC 212 is turned off, at the time of outputting the reference signal DAOUT of the positive voltage, and the DAC 211 is turned off, and the DAC 212 is turned on, at the time of outputting the reference signal DAOUT of the negative voltage, the power consumption P at the time of outputting the reference signal DAOUT of the positive voltage, is represented by an expression of P=Vdd×Idd, and the power consumption P at the time of outputting the reference signal DAOUT of the negative voltage, is represented by an expression of P=Vdd×Idd+Vss×Iss.

Therefore, it is possible to suppress the power consumption by a decrease in the power consumption P at the time of outputting the reference signal DAOUT of the positive voltage, from Vdd×Idd+Vss×Iss to Vdd×Idd.

Furthermore, when the DAC 211 is switched to the DAC 212, that is, when the DAC 211 is turned off, and the DAC 212 is turned on, in the decoder 213, the selection of the terminal A or B of the switch SW of the DAC 212, is controlled such that the current flowing from the DAC 211 to the load resistance R immediately before the switch, is identical to the current flowing from the DAC 212 to the load resistance R immediately after the switch.

Figure 6:
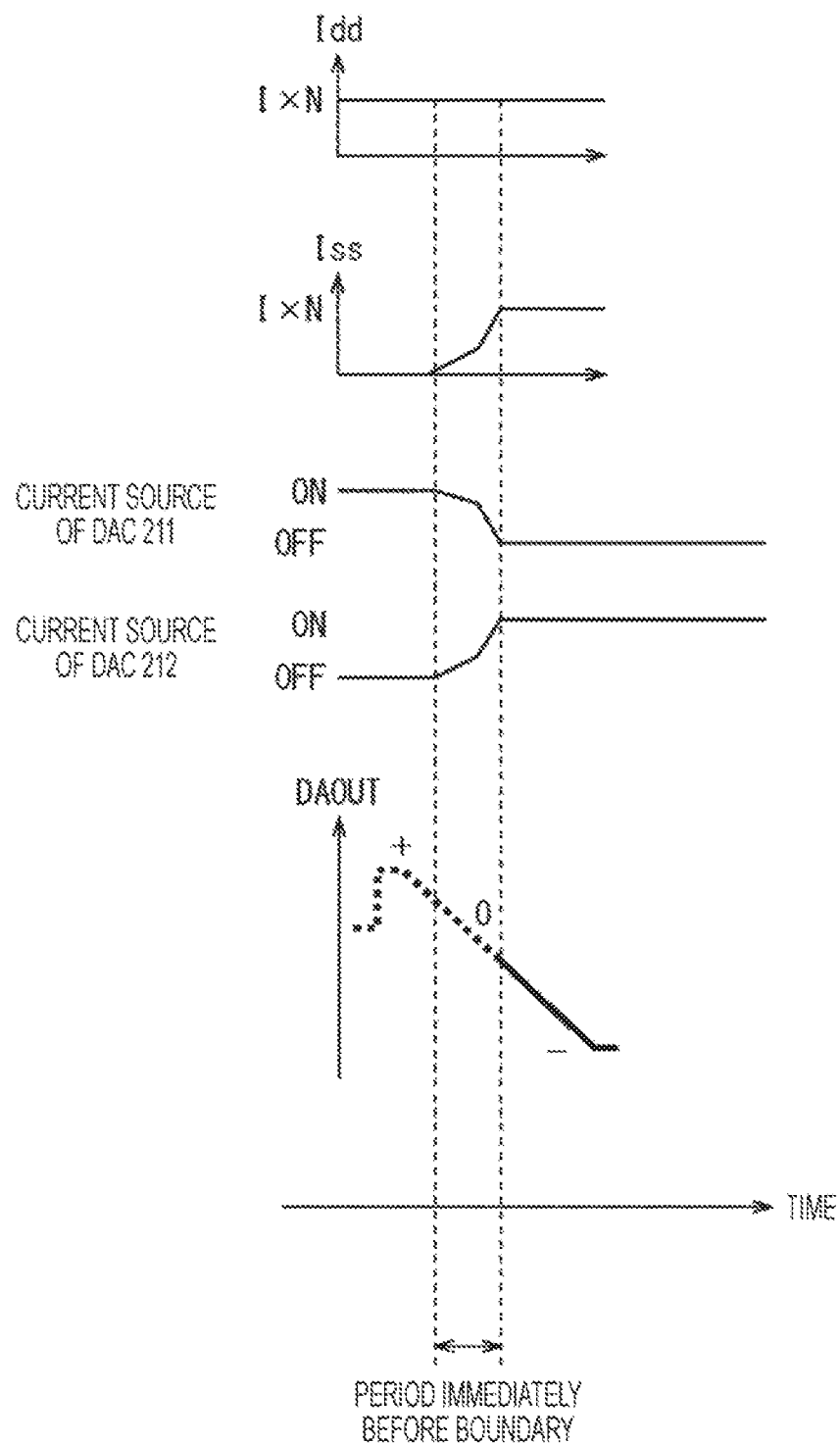
FIG. 6 is a timing chart describing another example of the operation of the first configuration example of the reference signal output unit 33.

FIG. 6 is a timing chart describing another example of the operation of the reference signal output unit 33 of FIG. 4.

That is, FIG. 6 illustrates another example of the current Idd flowing through the power source 111, the current Iss flowing through the power source 112, the On/Off state of the current source I of the DACs 211 and 212, and the reference signal DAOUT.

Here, the DAC used for outputting the reference signal DAOUT, that is, the DAC allowing the current to flow to the load resistance R, may be referred to as an valid DAC, and the DAC which is not the valid DAC, may be referred to as an invalid DAC.

In FIG. 5, when the reference signal DAOUT is 0 V which is the minimum voltage that can be output by using the DAC 211, the valid DAC is instantaneously switched from the DAC 211 to the DAC 212, and the switch of the valid DAC can be performed gradually (smoothly).

That is, in FIG. 5, when the reference signal DAOUT is 0 V, all of the current sources I of the DAC 211 are turned off, and all of the current sources I of the DAC 212 are turned on, and thus, the switch of the valid DAC is instantaneously performed, but the switch of the valid DAC can be performed by gradually turning off the current source I of the DAC 211, and by gradually turning on the current source I of the DAC 212, after the reference signal DAOUT is a predetermined voltage before being 0 V.

Specifically, as illustrated in FIG. 6, in a case where the reference signal DAOUT is the predetermined voltage before being 0 V, the N current sources I of the DAC 211, turned on, for example, are sequentially controlled such that the N current sources I are turned off, one by one or multiple by multiple.

Simultaneously, as illustrated in FIG. 6, the N current sources I of the DAC 212, turned off, are sequentially controlled such that the N current sources I are turned on, by the number of current sources I of the DAC 211, turned off.

Then, when the reference signal DAOUT is 0 V, all of the current sources I of the DAC 211 are controlled such that the current sources I are turned off, and all of the current sources I of the DAC 212 are controlled such that the current sources I are turned on.

As described above, the current sources I of the DAC 212 are turned on by the number of current sources I of the DAC 211, turned off, and thus, the total amount of the currents flowing to the DACs 211 and 212, that is, the current Idd flowing through the power source 111 remains constant as I×N, as illustrated in FIG. 6.

On the other hand, as illustrated in FIG. 6, in the DAC 212, the current Iss flowing to the power source 112 from the DAC 212 increases as the number of current sources I to be turned on, increases, and when the reference signal DAOUT is 0 V, that is, when all of the current sources I of the DAC 211 are turned off, and all of the current sources I of the DAC 212 are turned on, the current Iss is I×N.

In the DACs 211 and 212, the current flowing to the load resistance R, is distributed according to the current sources I turned on, until the reference signal DAOUT is 0 V from the predetermined voltage before being 0 V.

The decoder 213 controls the switch SW of the DACs 211 and 212 such that a current in which the reference signal DAOUT of a desired voltage can be obtained, flows to the load resistance R.

As described above, in a case where the switch of the valid DAC is gradually performed, it is possible to prevent the reference signal DAOUT from being unstable, compared to a case where the switch of the valid DAC is instantaneously performed.

That is, in a case where the switch of the valid DAC is instantaneously performed, the path of the current flowing to the load resistance R is instantaneously switched from the DAC 211 to the DAC 212. For this reason, when the valid DAC is switched, there is a concern that the reference signal DAOUT is unstable.

On the other hand, in a case where the switch of the valid DAC is gradually performed, the path of the current flowing to the load resistance R is switched from the DAC 211 to both of the DACs 211 and 212, and finally, is switched to the DAC 212, and thus, the path of the current flowing to the load resistance R is instantaneously switched to another path, and thus, it is possible to prevent the reference signal DAOUT from being unstable.

Further, in the case of FIG. 6, similarly to the case of FIG. 5, it is possible to suppress the power consumption. However, in the case of FIG. 6, the switch of the valid DAC is gradually performed, that is, the current source I of the DAC 212 is sequentially turned on, until the reference signal DAOUT is 0 V from the predetermined voltage before being 0 V, and thus, the current Iss flowing to the power source 112 from the DAC 212, gradually increases.

In the case of FIG. 6, as described above, the power consumption increases by a gradual increase in the current Iss flowing to the power source 112, until the reference signal DAOUT is 0 V from the predetermined voltage before being 0 V, but as a tradeoff thereof, it is possible to prevent the reference signal DAOUT from being unstable, as described above.

Furthermore, in embodiments described below, the switch of the valid DAC can be gradually performed, but for the sake of simple description, in the following embodiments, the case of instantaneously performing the switch of the valid DAC, will be described as an example.

<Second Configuration Example of Reference Signal Output Unit 33>

Figure 7:
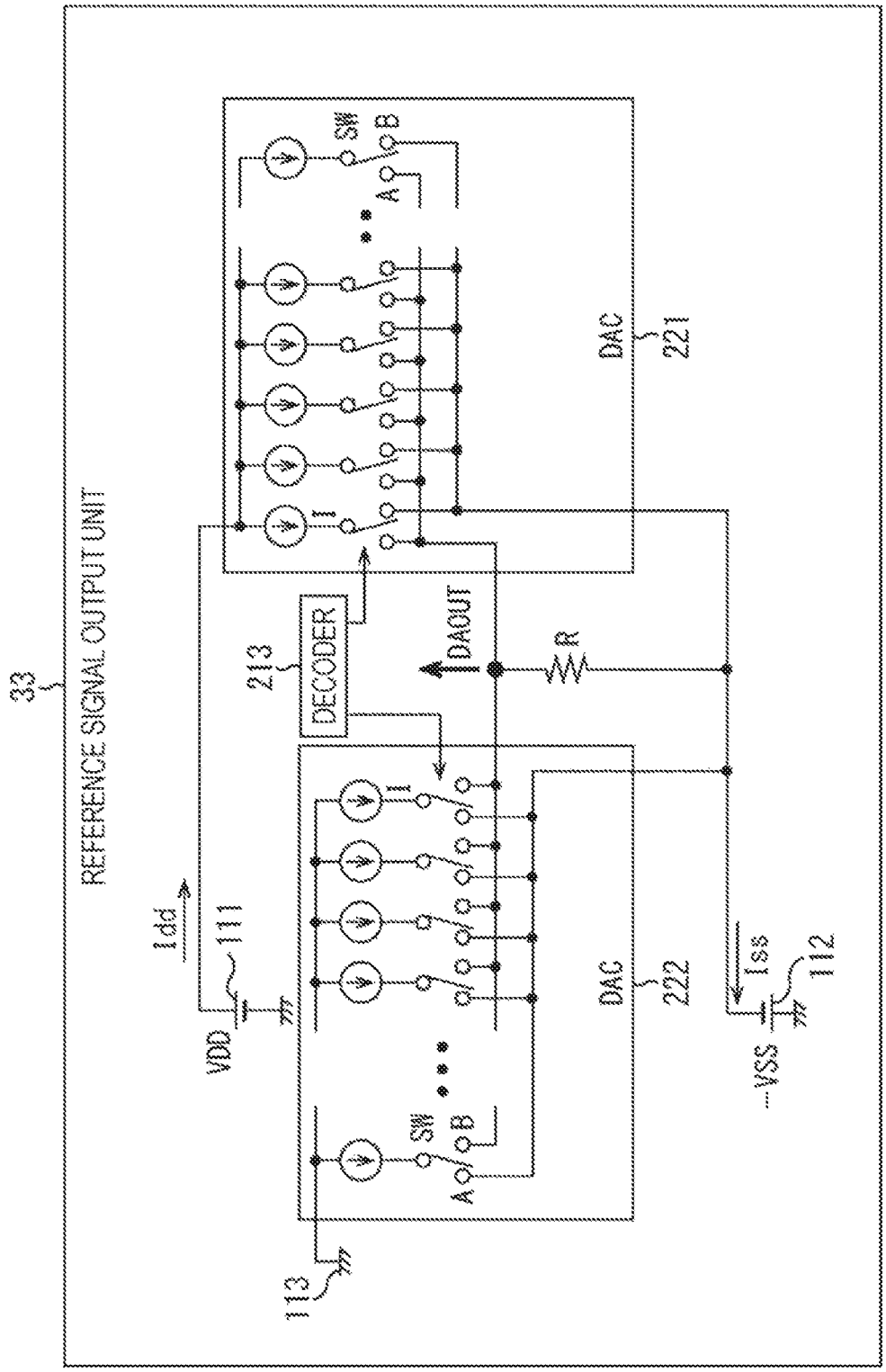
FIG. 7 is a circuit diagram illustrating a second configuration example of the reference signal output unit 33.

FIG. 7 is a circuit diagram illustrating a second configuration example of the reference signal output unit 33.

Furthermore, in the drawing, the same reference numerals will be applied to portions corresponding to those in the case of FIG. 4, and hereinafter, the description thereof will be suitably omitted.

In FIG. 7, the reference signal output unit 33 includes the decoder 213, DACs 221 and 222, and the load resistance R.

Therefore, the reference signal output unit 33 of FIG. 7 is common to the case of FIG. 4, in that the decoder 213 and the load resistance R are provided, and is different from the case of FIG. 4, in that each of the DACs 221 and 222 is provided instead of the DACs 211 and 212.

In FIG. 7, the reference signal output unit 33 is connected to the power source 111 of the positive voltage VDD, the power source 112 of the negative voltage −VSS, and the power source 113 which is the GND. That is, the DAC 221 is connected to the power sources 111 and 112, and the DAC 222 is connected to the power sources 112 and 113.

Each of the DACs 221 and 222 includes the plurality of current sources I, and the plurality of switches SW of the same number as the number of current sources I, the switches SW controlling the current I flowing from each of the current sources I. In each of the DACs 221 and 222, the number of current sources I may be the same, or may be different.

In the DAC 221, one end of the current source I is connected to the power source 111, and the other end of the current source I is connected to the switch SW.

In the DAC 221, the switch SW selects the left terminal A or the right terminal B, according to the control of the decoder 213, and with this arrangement, the current I flowing from the current source I connected to the switch SW, is controlled.

In the DAC 221, the terminal A is connected to the upper end of the load resistance R, and the terminal B is connected to the power source 112.

In the DAC 222, one end of the current source I is connected to the GND as the power source 113, and the other end of the current source I is connected to the switch SW.

In the DAC 222, the switch SW selects the left terminal A or the right terminal B, according to the control of the decoder 213, and with this arrangement, the current I flowing from the current source I connected to the switch SW, is controlled.

In the DAC 222, the terminal A is connected to the power source 112, and the terminal B is connected to the upper end of the load resistance R.

The switch SW of the DACs 221 and 222 is controlled by the decoder 213. That is, the decoder 213 counts a digital value, according to the control of the control unit 20 (FIG. 2), and the switch SW of the DACs 221 and 222 selects the terminal A or B such that a (analog) current corresponding to the digital value, flows through the load resistance R.

In FIG. 7, as described above, the terminal A of the DAC 221, and the terminal B of the DAC 222 are connected to the upper end of the load resistance R. In addition, the lower end of the load resistance R is connected to the power source 112, and the voltage DAOUT of the upper end of the load resistance R, is output as the reference signal DAOUT.

Therefore, in FIG. 7, the voltage as the reference signal DAOUT, is a voltage based on the voltage −VSS of the power source 112, and in a case where the current flowing to the load resistance R is represented as i, the voltage is represented by an expression of DAOUT=iR−VSS.

In the reference signal output unit 33 of FIG. 7, the combination of the power sources 111 and 112 connected to the DAC 221, includes a path extending from the power source 111 to the power source 112 through the current source I and the terminal B of the DAC 221, and a path extending from the power source 111 to the power source 112 through the current source I and the terminal A of the DAC 221, and the load resistance R, as the first path through which the current controlled by the switch SW of the DAC 221, flows.

Further, the combination of the power sources 111 and 112, includes the path extending from the power source 111 to the power source 112 through the current source I and the terminal A of the DAC 221, and the load resistance R, as the second path through which the current in the same direction, flows to the load resistance R.

In addition, the combination of the power sources 112 and 113 connected to the DAC 222, includes a path extending from the power source 113 to the power source 112 through the current source I, the terminal A, and the current source I of the DAC 222, a path extending from the power source 113 to the power source 112 through the current source I and the terminal B of the DAC 222, and the load resistance R, as the first path through which the current controlled by the switch SW of the DAC 222, flows.

Further, the combination of the power sources 112 and 113, includes the path extending from the power source 113 to the power source 112 through the current source I and the terminal B of the DAC 222, and the load resistance R, as the second path through which the current in the same direction, flows to the load resistance R.

Here, the DAC 221 exists on the first path and the second path of the combination of the power sources 111 and 112 connected to the DAC 221. Similarly, the DAC 222 exists on the first path and the second path of the combination of the power sources 112 and 113 connected to the DAC 222.

In the reference signal output unit 33 configured as described above, the current flowing from the current source I of the DAC 221, flows to the power source 112 from the power source 111, through the terminal B of the switch SW of the DAC 221, or through the terminal B of the switch SW of the DAC 221, and the load resistance R.

Therefore, in a case where the DAC 221 includes the N current sources I, the DAC 221 allows a constant current of the current I×N to flow towards the power source 113 from the power source 111, regardless of the selection of the terminal A or B according to the switch SW of the DAC 221.

As a result thereof, in consideration of only the DAC 221, in the reference signal output unit 33, the constant current I×N flows regardless of the selection of the terminal A or B according to the switch SW of the DAC 221, and thus, it is possible to prevent an error from occurring in the AD conversion of the ADC $31_n$ due to a fluctuation in the current flowing to the reference signal output unit 33.

In addition, in the reference signal output unit 33, the current flowing from the current source I of the DAC 222, flows to the power source 112 from the power source 113, through the terminal A of the switch SW of the DAC 222, or through the terminal B of the switch SW of the DAC 222, and the load resistance R.

Therefore, in a case where the DAC 222 includes the N current sources I, the DAC 222 allows a constant current of the current I×N to flow towards the power source 112 from the power source 113, regardless of the selection of the terminal A or B according to the switch SW of the DAC 222.

As a result thereof, in consideration of only the DAC 222, in the reference signal output unit 33, the constant current IX N flows regardless of the selection of the terminal A or B according to the switch SW of the DAC 222, and thus, it is possible to prevent an error from occurring in the AD conversion of the ADC $31_n$ due to a fluctuation in the current flowing to the reference signal output unit 33.

Furthermore, in FIG. 7, in the current flowing from the current source I of the DAC 221, the current flowing to the power source 112 from the power source 111 through the terminal B of the switch SW of the DAC 221, is a current not contributing to the generation of the reference signal DAOUT, and is a current to be discarded to the power source 112.

Similarly, in the current flowing from the current source I of the DAC 222, the current flowing to the power source 122 from the power source 113 through the terminal A of the switch SW of the DAC 222, is a current to be discarded to the GND as the power source 113.

As described above, in a case where the current flowing to the load resistance R, is represented as i, the reference signal DAOUT output by the reference signal output unit 33 of FIG. 7 is represented by an expression of DAOUT=iR−VSS. That is, the voltage as the reference signal DAOUT decreases as the current flowing to the load resistance R decreases.

For example, focusing on the DAC 221, in the DAC 221, when all of the switches SW select the terminal A, the current flowing to the load resistance R is maximized, and the voltage as the reference signal DAOUT is maximized. In addition, in the DAC 221, the current flowing through the load resistance R decreases, and the voltage as the reference signal DAOUT decreases, as the number of switches SW selecting the terminal B increases. Then, in the DAC 221, when all of the switches SW select the terminal B, the current flowing to the load resistance R is minimized, and the voltage as the reference signal DAOUT is minimized.

Therefore, for example, in the DAC 221, the number of switches SW selecting the terminal B from the terminal A increases, and thus, it is possible to generate the reference signal DAOUT having a slope in which the level decreases at a constant change rate.

In the reference signal output unit 33 of FIG. 7, the DAC 221 is connected to the power source 111 of the positive voltage VDD and the power source 112 of the negative voltage −VSS, and thus, in the DACs 221 and 222, only the DAC 221 is operated, and the current flowing to the load resistance R, is controlled by the switch SW of the DAC 221, and therefore, it is possible to generate the reference signal DAOUT of a voltage in a range from the positive voltage of less than or equal to the positive voltage VDD to the negative voltage of greater than or equal to the negative voltage −VSS.

However, in a case where the reference signal DAOUT of the voltage in the range from the positive voltage to the negative voltage is generated by operating only the DAC 221, in the DAC 221, at all times, the constant current I×N described above, flows.

Therefore, the current Idd flowing from the power source 111 of the positive voltage VDD, and the current Iss flowing to the power source 113 of the negative voltage −VSS, are the constant current I×N.

Then, in a case where the reference signal DAOUT of the voltage in the range from the positive voltage to the negative voltage is generated by operating only the DAC 221, the power consumption P of the reference signal output unit 33, normally, is power represented by an expression of P=Vdd×Idd+Vss×Iss.

The reference signal output unit 33 of FIG. 7, includes the DAC 222 connected to the power source 112 of the negative voltage −VSS, and the power source 113 which is the GND, in addition to the DAC 221 connected to the power source 111 of the positive voltage VDD, and the power source 112 of the negative voltage −VSS.

In the DAC 221 connected to the power source 111 of the positive voltage VDD, and the power source 112 of the negative voltage −VSS, as described above, it is possible to generate the reference signal DAOUT of the voltage in the range from the positive voltage of less than or equal to the positive voltage VDD to the negative voltage of greater than or equal to the negative voltage −VSS.

In addition, the current flowing from the DAC 221, flows between the power source 111 of the positive voltage VDD and the power source 112 of the negative voltage −VSS. Therefore, the power consumption of the current flowing from the DAC 221, is a product of the current and the voltage VDD+VSS.

On the other hand, in the DAC 222 connected to the power source 112 of the negative voltage −VSS, and the power source 113 which is the GND, it is possible to generate the reference signal DAOUT of a voltage in a range from 0 V which is the voltage of the GND, to the negative voltage of greater than or equal to the negative voltage −VSS.

In addition, the current flowing from the DAC 222, flows between the power source 112 of the negative voltage −VSS and the power source 113 which is the GND. Therefore, the power consumption of the current flowing from the DAC 222, is a product of the current and the voltage VSS.

For the sake of simple description, in a case where the current flowing from the DAC 221, is identical to the current flowing from the DAC 222, the power consumption of the current flowing from the DAC 221 is greater than the power consumption of the current flowing from the DAC 222 by the negative voltage −VSS of the power source 112 connected to the DAC 221. In other words, the power consumption of the current flowing from the DAC 222 is less than the power consumption of the current flowing from the DAC 221.

As described above, according to the DAC 221, it is possible to generate the reference signal DAOUT of the voltage in the range from the positive voltage to the negative voltage, but the power consumption increases.

On the other hand, according to the DAC 222, it is possible to generate only the reference signal DAOUT of the voltage in the range from 0 V to the negative voltage, that is, it is not possible to generate the reference signal DAOUT of the positive voltage, but the power consumption decreases.

Therefore, in the reference signal output unit 33, the DAC used for outputting the reference signal DAOUT, is changed according to the range of the voltage to be output as the reference signal DAOUT, and thus, it is possible to output the reference signal DAOUT of the voltage in the range from the positive voltage to the negative voltage, and to suppress the power consumption.

That is, in the reference signal output unit 33, for example, the reference signal DAOUT of the voltage in the range from the positive voltage to 0 V, is output by using DAC 221 as the valid DAC, in the DACs 221 and 222. Then, the reference signal DAOUT of the voltage in the range from 0 V to the negative voltage, is output by using the DAC 222 as the valid DAC.

Figure 8:
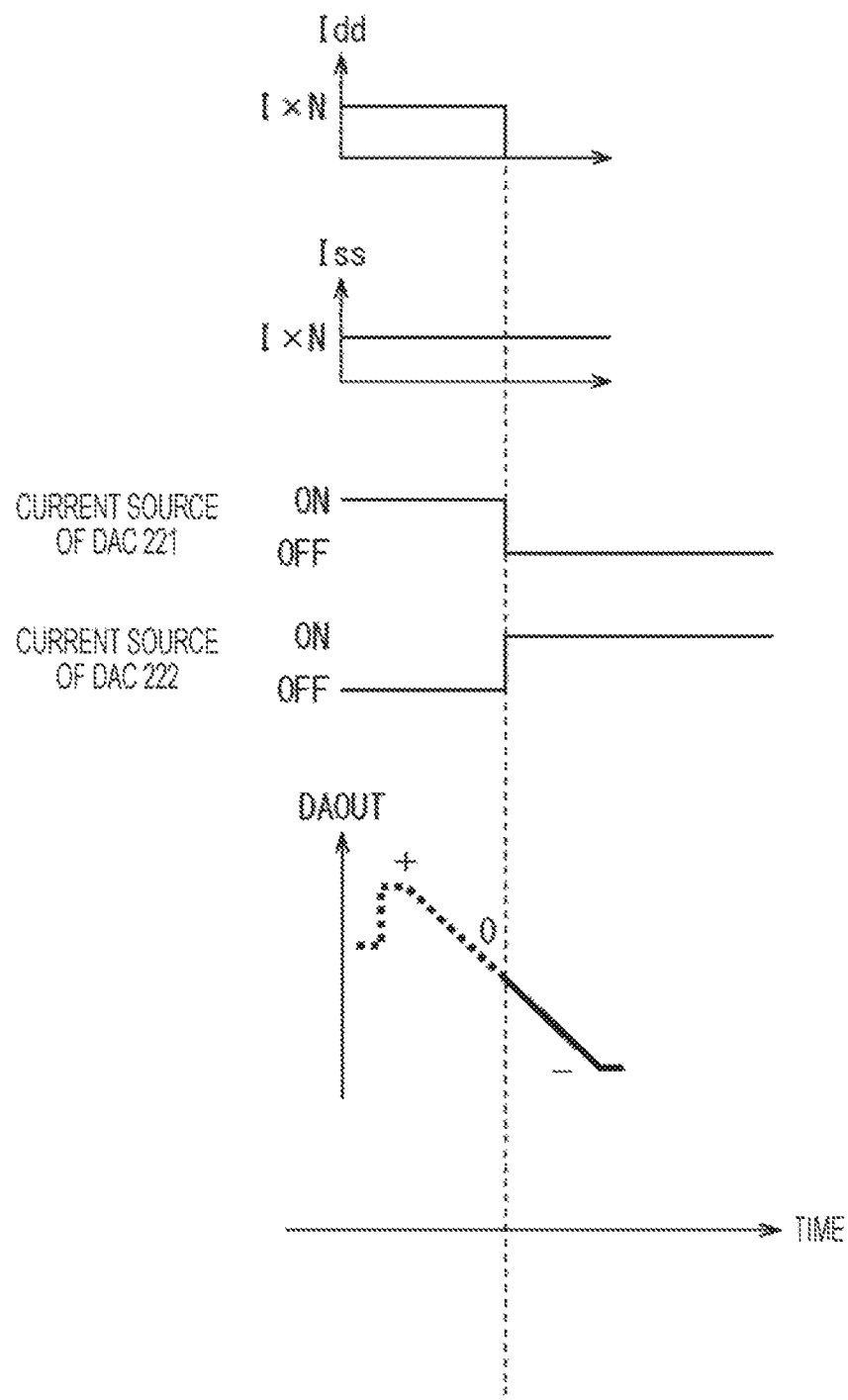
FIG. 8 is a timing chart describing an example of the operation of the second configuration example of the reference signal output unit 33.

FIG. 8 is a timing chart describing an example of the operation of the reference signal output unit 33 of FIG. 7.

That is, FIG. 8 illustrates an example of the current Idd flowing through the power source 111, the current Iss flowing through the power source 112, the On/Off state of the current source I of the DACs 221 and 222, and the reference signal DAOUT.

Furthermore, here, for the sake of simple description, both of the number of current sources I of the DAC 221, and the number of current sources I of the DAC 222 are set to N. In this case, both of the current flowing from the DAC 221, and the current flowing from the DAC 222, are a constant current of I×N.

In the output of the reference signal DAOUT which is changed from the positive voltage to the negative voltage, in order to output the reference signal DAOUT of the voltage in the range from the positive voltage to 0 V, as illustrated in FIG. 8, the current source I of the DAC 221 is controlled such that the current source I is turned on, and the current source I of the DAC 222 is controlled such that the current source I is turned off.

In the DAC 221 (of which the current source I is) turned on, the decoder 213 controls the switch SW such that the number of switches SW selecting the terminal B from the terminal A increases, and with this arrangement, the reference signal DAOUT gradually decreases, as illustrated in FIG. 8.

The current Idd flowing through the power source 111, is the constant current I×N flowing from (all of the current sources I of) the DAC 221, while the reference signal DAOUT of the positive voltage is output.

In addition, the current source I of the DAC 222 is turned off while the reference signal DAOUT of the positive voltage is output, and thus, the current flowing from the DAC 222, is 0.

Therefore, the current Iss flowing to the power source 112 to which the current flowing from the DACs 221 and 222, flows, is the constant current I×N.

After that, in a case where the reference signal DAOUT is 0 V which is the maximum voltage that can be output by using the DAC 222 (and not using the DAC 221), in the subsequent output of the reference signal DAOUT of the negative voltage, as illustrated in FIG. 8, the current source I of the DAC 221 is controlled such that the current source I is turned off, and the current source I of the DAC 222 is controlled such that the current source I is turned on.

The current source I of the DAC 221 is turned off, and thus, the current does not flow to the DAC 221, but the current source I of the DAC 222 is turned on, and thus, the current flowing from the DAC 222 is changed to I×N from 0.

The current flowing from the DAC 221, is changed to 0 from I×N, and thus, the current Idd flowing to power source 111 connected to the DAC 221, is 0, as illustrated in FIG. 8.

In addition, the current flowing from the DAC 221 connected to the power source 112, is changed to 0 from I×N, and the current flowing from the DAC 222 connected to the power source 112, is changed to I×N from 0, and thus, as illustrated in FIG. 8, the current Iss flowing through the power source 112 remains as I×N.

In the DAC 222 turned on, the decoder 213 controls the switch SW such that the number of switches SW selecting the terminal A from the terminal B increases, and with this arrangement, the reference signal DAOUT gradually decreases, as illustrated in FIG. 8.

As described above, the DAC used for outputting the reference signal DAOUT is changed according to the range of the voltage to be output as the reference signal DAOUT, and in the range of DAOUT>0, the DAC 221 connected to the (positive) power source 111 of the positive voltage VDD, and the power source 112 of the negative voltage −VSS, is operated, and in the range of DAOUT<0, the DAC 222 connected to the (negative) power source 112 of the negative voltage −VSS, and the power source 113 which is the GND, is operated, and thus, it is possible to suppress the power consumption.

That is, (the current source I of) the DAC 221 is turned on, and the DAC 222 is turned off, at the time of outputting the reference signal DAOUT of the positive voltage, and the DAC 221 is turned off, and the DAC 222 is turned on, at the time of outputting the reference signal DAOUT of the negative voltage, and thus, it is possible to suppress the power consumption in order to output the reference signal DAOUT of the voltage in the range from the positive voltage to the negative voltage.

Specifically, only the DAC 221 connected to the power source 111 of the positive voltage VDD, and the power source 112 of the negative voltage −VSS, is turned on (operated), and in a case where the reference signal DAOUT of the voltage in the range from the positive voltage to the negative voltage, is output, as illustrated in FIG. 7, the power consumption P of the reference signal output unit 33, normally, is power represented by an expression of P=Vdd×Idd+Vss×Iss.

On the other hand, in a case where the DAC 221 is turned on, and the DAC 222 is turned off, at the time of outputting the reference signal DAOUT of the positive voltage, and the DAC 221 is turned off, and the DAC 222 is turned on, at the time of outputting the reference signal DAOUT of the negative voltage, the power consumption P at the time of outputting the reference signal DAOUT of the positive voltage, is represented by an expression of P=Vdd×Idd+Vss×Iss, and the power consumption P at the time of outputting the reference signal DAOUT of the negative voltage, is represented by an expression of P=Vss×Iss.

Therefore, it is possible to suppress the power consumption by a decrease in the power consumption P at the time of outputting the reference signal DAOUT of the negative voltage, from Vdd×Idd+Vss×Iss to Vss×Iss.

Furthermore, when the DAC 221 is switched to the DAC 222, that is, when the DAC 221 is turned off, and the DAC 222 is turned on, in the decoder 213, the selection of the terminal A or B of the switch SW of the DAC 222, is controlled such that the current flowing from the DAC 221 to the load resistance R immediately before the switch, is identical to the current flowing from the DAC 222 to the load resistance R immediately after the switch.

<Third Configuration Example of Reference Signal Output Unit 33>

Figure 9:
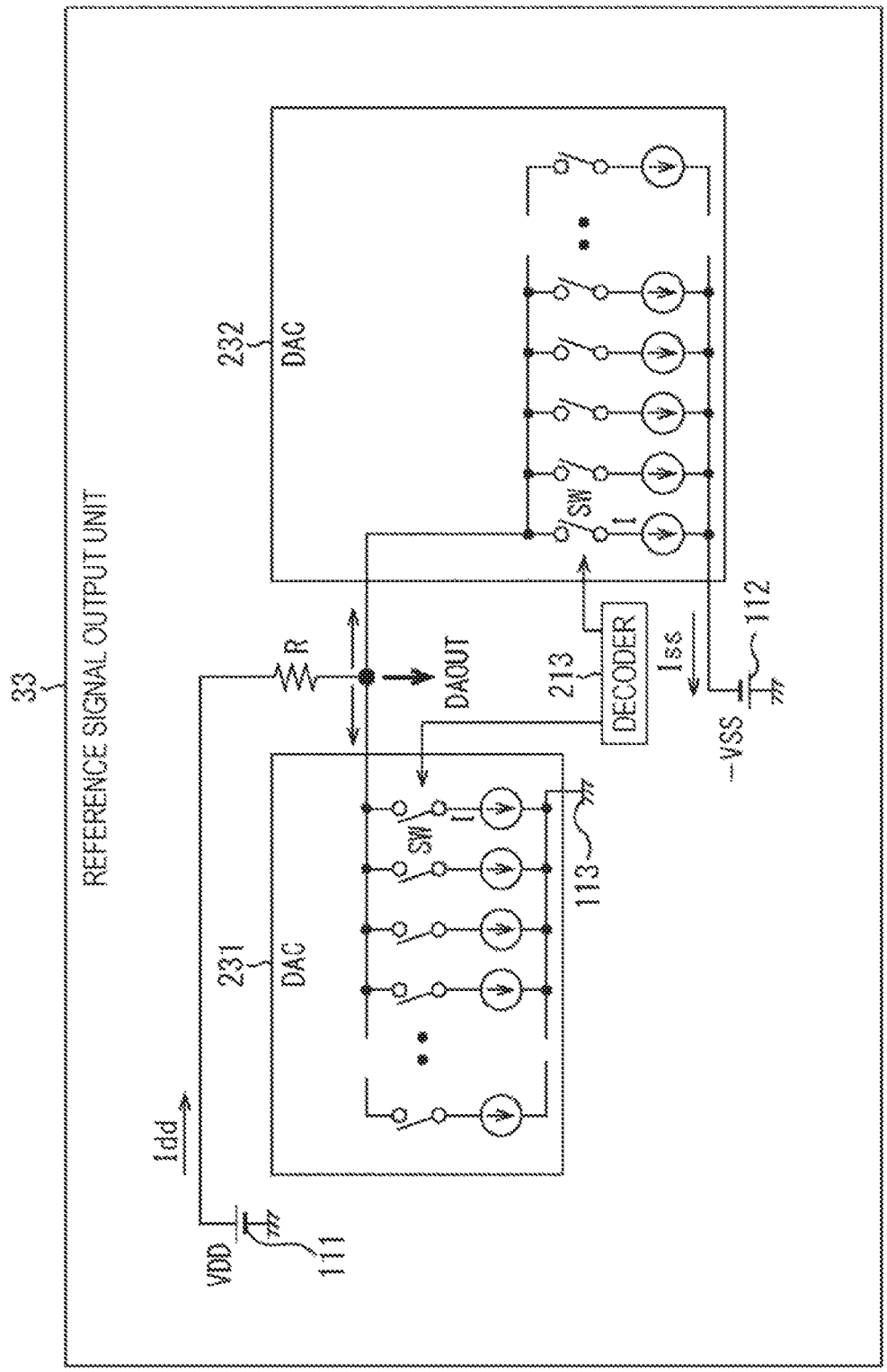
FIG. 9 is a circuit diagram illustrating a third configuration example of the reference signal output unit 33.

FIG. 9 is a circuit diagram illustrating a third configuration example of the reference signal output unit 33.

Furthermore, in the drawing, the same reference numerals will be applied to portions corresponding to those in the case of FIG. 4, and hereinafter, the description thereof will be suitably omitted.

In FIG. 9, the reference signal output unit 33 includes the decoder 213, DACs 231 and 232, and the load resistance R.

Therefore, the reference signal output unit 33 of FIG. 9 is common to the case of FIG. 4, in that the decoder 213 and the load resistance R are provided, and is different from the case of FIG. 4, in that each of the DACs 231 and 232 is provided instead of the DACs 211 and 212.

In FIG. 9, the reference signal output unit 33 is connected to the power source 111 of the positive voltage VDD, the power source 112 of the negative voltage −VSS, and the power source 113 which is the GND. That is, the DAC 231 is connected to the power sources 111 and 113, and the DAC 232 is connected to the power sources 111 and 112.

Each of the DACs 231 and 232 includes the plurality of current sources I, and the plurality of switches SW of the same number as the number of current sources I, the switches SW controlling the current I flowing from each of the current sources I. In each of the DACs 231 and 232, the number of current sources I may be the same, or may be different.

In the DAC 231, one end of the current source I is connected to the power source 113, and the other end of the current source I is connected to the switch SW.

In the DAC 231, the On/Off of the switch SW is performed according to the control of the decoder 213, and with this arrangement, the current I flowing from the current source I connected to the switch SW, is controlled.

In the DAC 231, On/Off of the connection between the lower end of the load resistance R and the current source I, is performed according to the On/Off of the switch SW.

In the DAC 232, one end of the current source I is connected to the power source 112, and the other end of the current source I is connected to the switch SW.

In the DAC 232, the On/Off of the switch SW is performed according to the control of the decoder 213, and with this arrangement, the current I flowing from the current source I connected to the switch SW, is controlled.

In the DAC 232, the On/Off of the connection between the lower end of the load resistance R and the current source I, is performed according to the On/Off of the switch SW.

The switch SW of the DACs 231 and 232, is controlled by the decoder 213. That is, the decoder 213 counts a digital value, according to the control of the control unit 20 (FIG. 2), and the On/Off of the switch SW of the DACs 231 and 232 is performed such that a (analog) current corresponding to the digital value, flows through the load resistance R.

In FIG. 9, the lower end of the load resistance R is connected to the current source I of the DAC 231 through the switch SW of the DAC 231, and is connected to the current source I of the DAC 232 through the switch SW of the DAC 232. In addition, the upper end of the load resistance R is connected to the power source 111, and the voltage DAOUT of the lower end of the load resistance R is output as the reference signal DAOUT.

Therefore, in FIG. 9, the voltage as the reference signal DAOUT, is a voltage based on the voltage VDD of the power source 111, and in a case where the current flowing to the load resistance R, is represented as i, the voltage is represented by an expression of DAOUT=VDD−iR.

In the reference signal output unit 33 of FIG. 9, the combination of the power sources 111 and 113 connected to the DAC 231, includes a path extending from the power source 111 to the power source 113 through the load resistance R, and a current source I of the DAC 231, as the first path through which the current controlled by the switch SW of the DAC 231, flows, and the second path through which the current in the same direction, flows to the load resistance R.

In addition, the combination of the power sources 111 and 112 connected to the DAC 232, includes a path extending from the power source 111 to the power source 112 through the load resistance R, and the current source I of the DAC 232, as the first path through which the current controlled by the switch SW of the DAC 232, flows, and the second path through which the current in the same direction, flows to the load resistance R.

Here, the DAC 231 exists on the first path and the second path of the combination of the power sources 111 and 113 connected to the DAC 231. Similarly, the DAC 232 exists on the first path and the second path of the combination of the power sources 111 and 112 connected to the DAC 232.

In the reference signal output unit 33 configured as described above, in the DAC 231, the current flowing from the current source I of which the switch SW is turned on, flows, and the current flows to the power source 113 from the power source 111, through the load resistance R and the DAC 231.

Similarly, in the DAC 232, the current flowing from the current source I of which the switch SW is turned on, flows, and the current flows to the power source 112 from the power source 111, through the load resistance R and the DAC 232.

As described above, in a case where the current flowing to the load resistance R, is represented as i, the reference signal DAOUT output by the reference signal output unit 33 of FIG. 9, is represented by an expression of DAOUT=VDD−iR. That is, the voltage as the reference signal DAOUT decreases as the current flowing to the load resistance R increases.

For example, focusing on the DAC 232, in the DAC 232, when all of the switches SW are turned off, the current flowing to the load resistance R is minimized, and the voltage as the reference signal DAOUT is maximized. In addition, in the DAC 232, the current flowing through the load resistance R increases, and the voltage as the voltage as the reference signal DAOUT decreases, as the number of switches SW to be turned on, increases. Then, in the DAC 232, when all of the switches SW are turned on, the current flowing to the load resistance R is maximized, and the voltage as the reference signal DAOUT is minimized.

Therefore, for example, in the DAC 232, the number of switches SW to be turned on, increases, and thus, it is possible to generate the reference signal DAOUT having a slope in which the level decreases at a constant change rate.

In the reference signal output unit 33 of FIG. 9, the DAC 232 is connected to the power source 111 of the positive voltage VDD, and the power source 112 of the negative voltage −VSS, and thus, in the DACs 231 and 232, only the DAC 232 is operated, and the current flowing to the load resistance R is controlled by the switch SW of the DAC 232, and thus, it is possible to generate the reference signal DAOUT of the voltage in the range from the positive voltage of less than or equal to the positive voltage VDD to the negative voltage of greater than or equal to the negative voltage −VSS.

However, in a case where the reference signal DAOUT of the voltage in the range from the positive voltage to the negative voltage is generated by operating only the DAC 232, the power consumption P of the reference signal output unit 33 is power represented by an expression of P=Vdd× Idd+Vss×Iss, in proportion to the current Idd flowing to the voltage VDD of the power source 111 connected to the DAC 232, and the current Iss flowing to the voltage −VSS of the power source 112 connected to the DAC 232.

However, the reference signal output unit 33 of FIG. 9, includes the DAC 231 connected to the power source 111 of the positive voltage VDD, and the power source 113 which is the GND, in addition to the DAC 232 connected to the power source 111 of the positive voltage VDD, and the power source 112 of the negative voltage −VSS.

In the DAC 232 connected to the power source 111 of the positive voltage VDD, and the power source 112 of the negative voltage −VSS, as described above, it is possible to generate the reference signal DAOUT of the voltage in the range from the positive voltage of less than or equal to the positive voltage VDD to the negative voltage of greater than or equal to the negative voltage −VSS.

In addition, the current flowing from the DAC 232, flows between the power source 111 of the positive voltage VDD and the power source 112 of the negative voltage −VSS. Therefore, the power consumption of the current flowing from the DAC 232, is a product of the current and the voltage VDD+VSS.

On the other hand, in the DAC 231 connected to the power source 111 of the positive voltage VDD, and the power source 113 which is the GND, it is possible to generate the reference signal DAOUT of the voltage in the range from the positive voltage of less than or equal to the positive voltage VDD to 0 V which is the voltage of the GND.

In addition, the current flowing from the DAC 231, flows between the power source 111 of the positive voltage VDD and the power source 113 which is the GND. Therefore, the power consumption of the current flowing from the DAC 231, is a product of the current and the voltage VDD.

For the sake of simple description, in a case where the current flowing from the DAC 231, is identical to the current flowing from the DAC 232, the power consumption of the current flowing from the DAC 232 is greater than the power consumption of the current flowing from the DAC 231 by negative voltage −VSS of the power source 112 connected to the DAC 232. In other words, the power consumption of the current flowing from the DAC 231, is less than the power consumption of the current flowing from the DAC 232.

As described above, according to the DAC 232, it is possible to generate the reference signal DAOUT of the voltage in the range from the positive voltage to the negative voltage, but the power consumption increases.

On the other hand, according to the DAC 232, it is possible to generate only the reference signal DAOUT of the voltage in the range from the positive voltage to 0 V, that is, it is not possible to generate the reference signal DAOUT of the negative voltage, but the power consumption decreases.

Therefore, in the reference signal output unit 33, the DAC used for outputting the reference signal DAOUT, is changed according to the range of the voltage to be output as the reference signal DAOUT, and thus, it is possible to output the reference signal DAOUT of the voltage in the range from the positive voltage to the negative voltage, and to suppress the power consumption.

That is, in the reference signal output unit 33, for example, the reference signal DAOUT of the voltage in the range from the positive voltage to 0 V, is output by using DAC 231 as the valid DAC, in the DACs 231 and 232. Then, the reference signal DAOUT of the voltage in the range from 0 V to the negative voltage, is output by using the DAC 232 as the valid DAC.

Furthermore, in the reference signal output unit 33 of FIG. 9, the current flowing from the DACs 231 and 232 fluctuates, but as with the case of the FIG. 4 or FIG. 7, there is no current to be discarded, and thus, it is possible to further suppress the current consumption by the amount of current to be discard.

In addition, the reference signal output unit 33 of FIG. 9, similarly to the case of FIG. 4, has a configuration in which the upper end of the load resistance R is connected to the power source 111 of the positive voltage VDD, and the voltage DAOUT of the lower end of the load resistance R is output as the reference signal DAOUT (hereinafter, also referred to as a configuration based on the positive voltage), and similarly to the case of FIG. 7, a configuration in which the lower end of the load resistance R is connected to the power source 112 of the negative voltage −VSS, and the voltage DAOUT of the upper end of the load resistance R is output as the reference signal DAOUT (hereinafter, also referred to as a configuration based on the negative voltage) can be adopted as the configuration of the reference signal output unit 33 including the DACs 231 and 232.

That is, both of the configuration based on the positive voltage and the configuration based on the negative voltage can be adopted as the configuration of the reference signal output unit 33.

Figure 10:
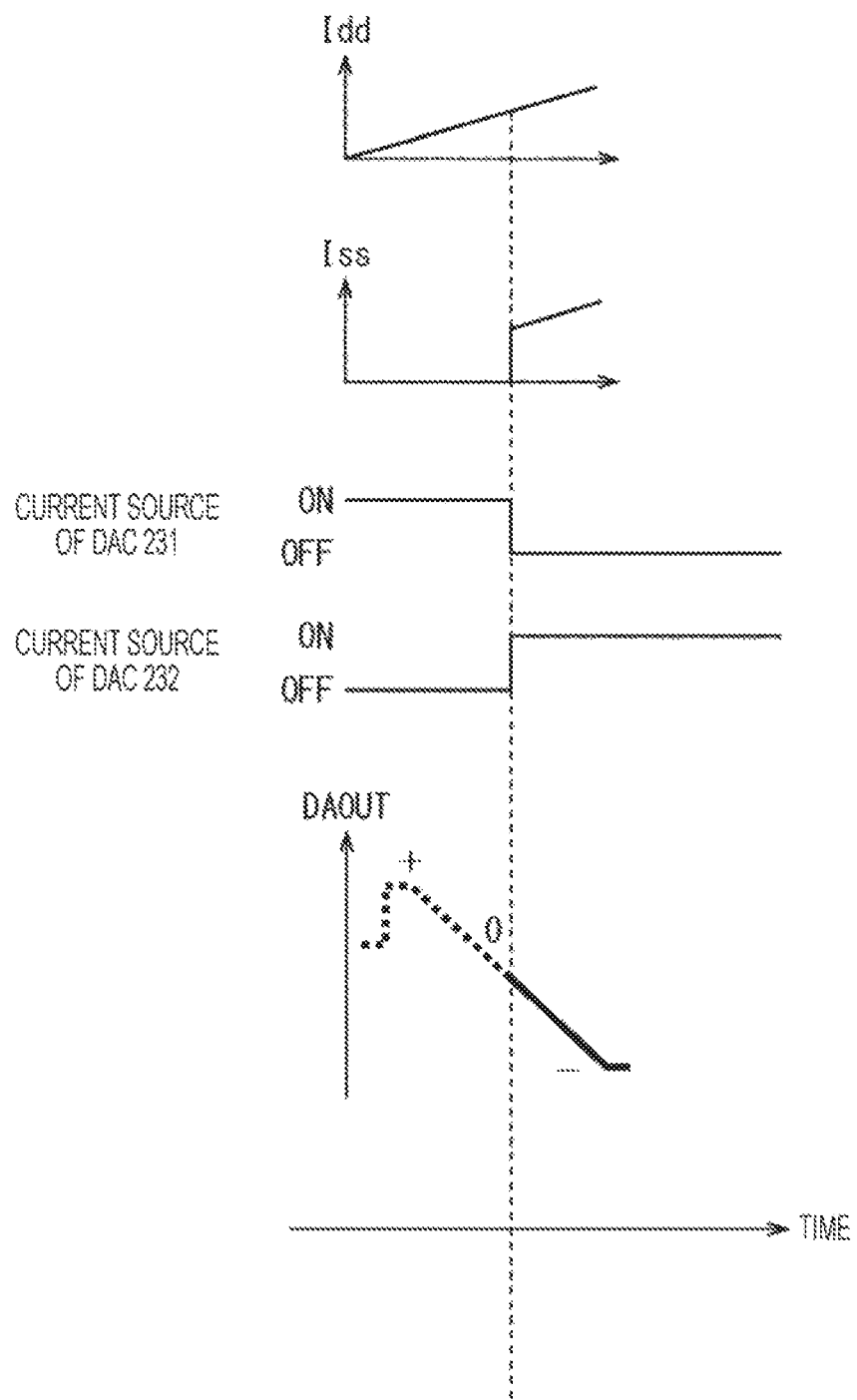
FIG. 10 is a timing chart describing an example of the operation of the third configuration example of the reference signal output unit 33.

FIG. 10 is a timing chart describing an example of the operation of the reference signal output unit 33 of FIG. 9.

That is, FIG. 10 illustrates an example of the current Idd flowing through the power source 111, current Iss flowing through the power source 112, the On/Off state of the current source I of the DACs 231 and 232, and the reference signal DAOUT.

In the output of the reference signal DAOUT which is changed from the positive voltage to the negative voltage, in order to output the reference signal DAOUT of the voltage in the range from the positive voltage to 0 V, as illustrated in FIG. 10, the current source I of the DAC 231 is controlled such that the current source I is turned on, and the current source I of the DAC 232 is controlled such that the current source I is turned off.

In the DAC 231 (of which the current source I is) turned on, the decoder 213 controls the switch SW such that the number of switches SW to be turned on from off, increases, and with this arrangement, the reference signal DAOUT gradually decreases, as illustrated in FIG. 10.

In the DAC 231, the current flowing through the DAC 231 increases according to the number of switches SW to be turned on, while the reference signal DAOUT of the positive voltage is output.

In addition, the current source I of the DAC 232 is turned off while the reference signal DAOUT of the positive voltage is output, and thus, the current flowing from the DAC 232 is 0.

Therefore, in the DAC 231, the current Idd flowing from the power source 111 to the DACs 231 and 232, increases according to the number of switches SW to be turned on.

In addition, the current Iss flowing to the power source 112 to which the current flowing from the DAC 232 flows, is 0.

After that, in a case where the reference signal DAOUT is 0 V which is the minimum voltage that can be output by using the DAC 231 (and not using the DAC 232), in the subsequent output of the reference signal DAOUT of the negative voltage, as illustrated in FIG. 10, the current source I of the DAC 231 is controlled such that the current source I is turned off, and the current source I of the DAC 232 is controlled such that the current source I is turned on.

The current source I of the DAC 231 is turned off, and thus, the current flowing from the DAC 231 is 0, and the current source I of the DAC 232 is turned on, and thus, the current flowing from the DAC 232 is changed to a predetermined value from 0.

That is, when the DAC 231 is switched to the DAC 232 by turning off the DAC 231, and by turning on the DAC 232, in the decoder 213, the switch SW of the DAC 232 is controlled such that the switch SW is turned on, such that the current flowing from the DAC 231 to the load resistance R immediately before the switch, is identical to the current flowing from the DAC 232 to the load resistance R immediately after the switch.

The current flowing from the DAC 232 is the predetermined value, and thus, the current Iss flowing to the power source 122 connected to the DAC 232, is also changed to the predetermined value from 0.

In addition, the current flowing from the DAC 231 is changed to 0 from the predetermined value, and the current flowing from the DAC 232 is changed to the predetermined value from 0, and thus, as illustrated in FIG. 10, the current Idd flowing through the power source 111 remains as the predetermined value.

In the DAC 232 turned on, the decoder 213 controls the switch SW such that the number of switches SW to be turned on from off, increases, and with this arrangement, the reference signal DAOUT gradually decreases, as illustrated in FIG. 10.

As described above, the DAC used for outputting the reference signal DAOUT, is changed according to the range of the voltage to be output as the reference signal DAOUT, and in the range of DAOUT>0, the DAC 231 connected to the (positive) power source 111 of the positive voltage VDD, is operated, and in the range of DAOUT<0, the DAC 232 connected to the (negative) power source 112 of the negative voltage −VSS, is operated, and thus, it is possible to suppress the power consumption.

That is, (the current source I of) the DAC 231 is turned on, and the DAC 232 is turned off, at the time of outputting the reference signal DAOUT of the positive voltage, and the DAC 231 is turned off, and the DAC 232 is turned on, at the time of outputting the reference signal DAOUT of the negative voltage, and thus, it is possible to suppress the power consumption in order to output the reference signal DAOUT of the voltage in the range from the positive voltage to the negative voltage.

Specifically, in a case where the reference signal DAOUT of the voltage in the range from the positive voltage to the negative voltage is output by turning on (operating) only the DAC 232 connected to the power source 111 of the positive voltage VDD, and the power source 112 of the negative voltage −VSS, as illustrated in FIG. 9, the power consumption P of the reference signal output unit 33, normally, is power represented by an expression of $P=Vdd \times Idd + Vss \times Iss$.

On the other hand, in a case where the DAC 231 is turned on, and the DAC 232 is turned off, at the time of outputting the reference signal DAOUT of the positive voltage, and the DAC 231 is turned off, and the DAC 232 is turned on, at the time of outputting the reference signal DAOUT of the negative voltage, the power consumption P at the time of outputting the reference signal DAOUT of the positive voltage, is represented by an expression of $P=Vdd \times Idd$, and the power consumption P at the time of outputting the reference signal DAOUT of the negative voltage, is represented by an expression of $P=Vdd \times Idd + Vss \times Iss$.

Therefore, it is possible to suppress the power consumption by a decrease in the power consumption P at the time of outputting the reference signal DAOUT of the positive voltage, from $Vdd \times Idd + Vss \times Iss$ to $Vdd \times Idd$.

<Fourth Configuration Example of Reference Signal Output Unit 33>

Figure 11:
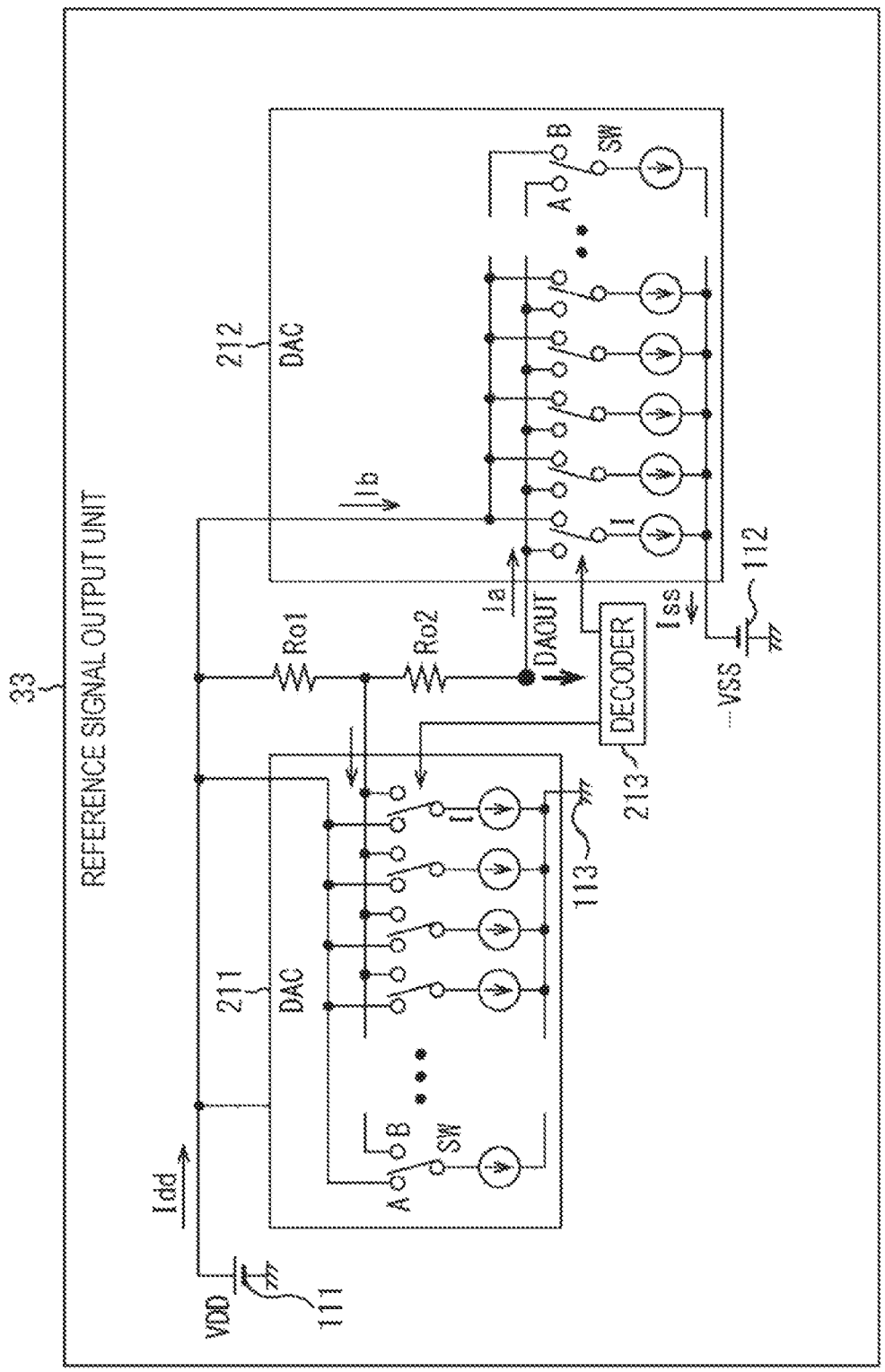
FIG. 11 is a circuit diagram illustrating a fourth configuration example of the reference signal output unit 33.

FIG. 11 is a circuit diagram illustrating a fourth configuration example of the reference signal output unit 33.

Furthermore, in the drawing, the same reference numerals will be applied to portions corresponding to those in the case of FIG. 4, and hereinafter, the description thereof will be suitably omitted.

In FIG. 11, the reference signal output unit 33 includes the DACs 211 and 212, the decoder 213, and load resistances Ro1 and Ro2.

Therefore, the reference signal output unit 33 of FIG. 11, is common to the case of FIG. 4, in that the DACs 211 and 212, and the decoder 213 are provided, and is different from the case of FIG. 4, in that two load resistances Ro1 and Ro2 are provided instead of one load resistance R.

In addition, in FIG. 4, the lower end of the load resistance R of which the upper end is connected to the power source 111, is connected to the terminal B of the DAC 211 and the terminal A of the DAC 212, but in FIG. 11, the lower end of the load resistance Ro1 of which the upper end is connected to the power source 111, is connected to the terminal B of the DAC 211 and the upper end of the load resistance Ro2, and the lower end of the load resistance Ro2 is connected to the terminal A of the DAC 212. Then, in FIG. 11, the voltage DAOUT of the lower end of the load resistance Ro2, is output as the reference signal DAOUT.

As described above, even in the reference signal output unit 33 including the two load resistances Ro1 and Ro2, similarly to the case of FIG. 4 including one load resistance R, the DAC used for outputting the reference signal DAOUT, is changed according to the range of the voltage to be output as the reference signal DAOUT, and thus, it is possible to output the reference signal DAOUT of the voltage in the range from the positive voltage to the negative voltage, and to suppress the power consumption.

That is, in the reference signal output unit 33, for example, the reference signal DAOUT of the voltage in the range from the positive voltage to 0 V, is output by using the DAC 211 as the valid DAC, in the DACs 211 and 212, and the reference signal DAOUT of the voltage in the range from 0 V to the negative voltage, is output by using the DAC 212 as the valid DAC, and thus, it is possible to suppress the power consumption.

Figure 12:
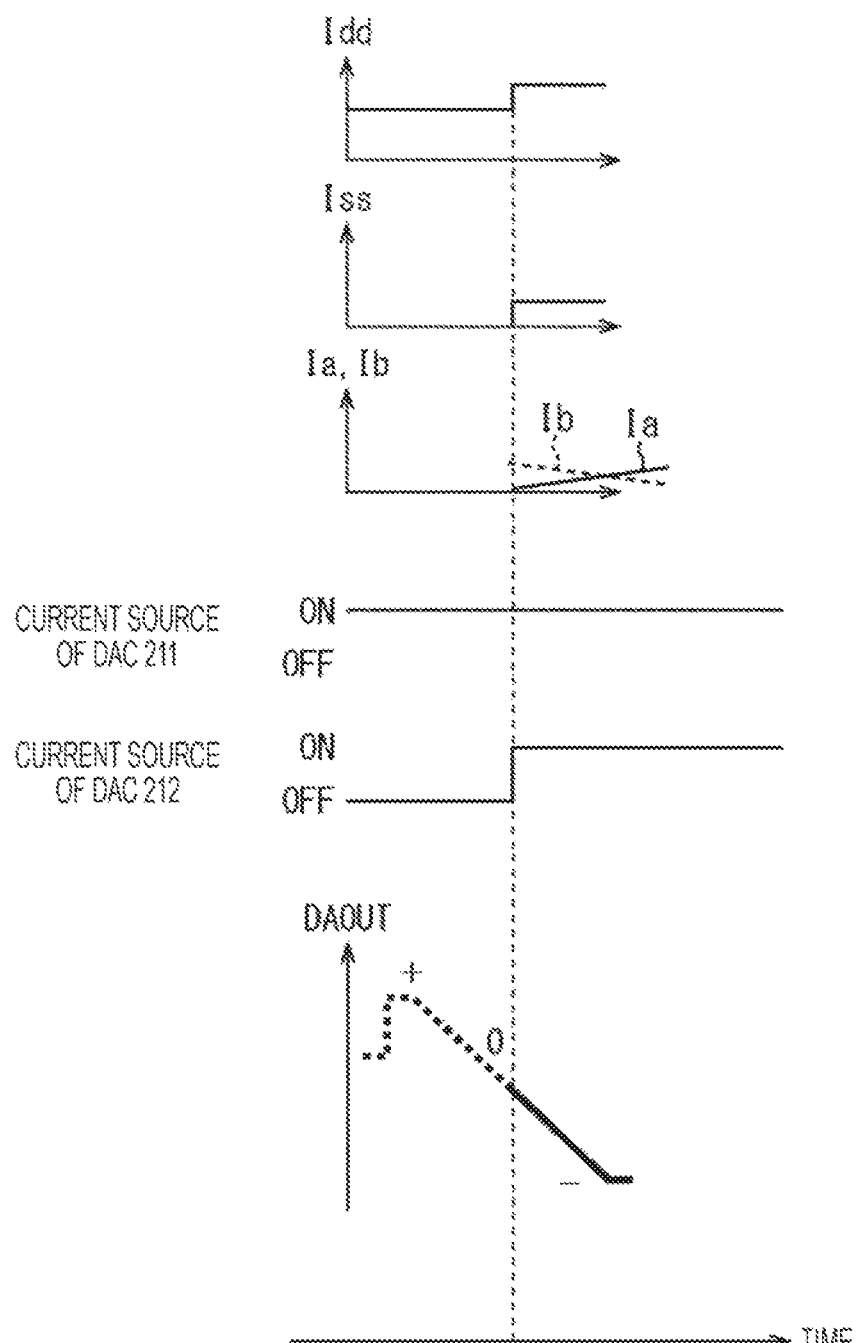
FIG. 12 is a timing chart describing an example of the operation of the fourth configuration example of the reference signal output unit 33.

FIG. 12 is a timing chart describing an example of the operation of the reference signal output unit 33 of FIG. 11.

That is, FIG. 12 illustrates an example of the current Idd flowing through the power source 111, the current Iss flowing through the power source 112, a current Ia flowing to the DAC 212 from the load resistance Ro2, a current Ib flowing to the DAC 212 in the current Idd flowing from the power source 111, the On/Off state of the current source I of the DACs 211 and 212, and the reference signal DAOUT.

In the output of the reference signal DAOUT which is changed from the positive voltage to the negative voltage, in order to output the reference signal DAOUT of the voltage in the range from the positive voltage to 0 V, as illustrated in FIG. 12, the current source I of the DAC 211 is controlled such that the current source I is turned on, and the current source I of the DAC 212 is controlled such that the current source I is turned off.

In the DAC 211 (of which the current source I is) turned on, the decoder 213 controls the switch SW such that the number of switches SW selecting the terminal B from the terminal A increases, and with this arrangement, the reference signal DAOUT gradually decreases, as illustrated in FIG. 12.

The current Idd flowing through the power source 111 is a constant current flowing from (all of the current sources I of) the DAC 211, while the reference signal DAOUT of the positive voltage is output.

In addition, the current source I of the DAC 212 is turned off while the reference signal DAOUT of the positive voltage is output, and thus, the current flowing from the DAC 212 is 0, and the currents Ia and Ib flowing to the DAC 212, and the current Iss flowing to the power source 112 connected to the DAC 212, are also 0.

The current Ia flowing to the DAC 212, that is, the current flowing to the load resistance Ro2, is 0, and thus, the voltage of the lower end of the load resistance Ro2, is identical to the voltage of the lower end of the load resistance Ro1, and the voltage is output as the reference signal DAOUT.

After that, in a case where the reference signal DAOUT is 0 V which is the minimum voltage that can be output by using the DAC 211 (and not using the DAC 212), in the subsequent output of the reference signal DAOUT of the negative voltage, as illustrated in FIG. 12, for example, the current source I of the DAC 211 remains as being turned on, and the current source I of the DAC 212 is controlled such that the current source I is turned on.

The current source I of the DAC 211 remains as being turned on, and thus, subsequently, the DAC 211 continuously allows the current when the reference signal DAOUT is 0 V, to flow.

In addition, the current source I of the DAC 212 is controlled such that the current source I is turned on, and thus, the current flowing from the DAC 212, that is, the current Iss flowing to the power source 112 from the DAC 212, as illustrated in FIG. 12, is changed to a predetermined value which is identical to the sum of the currents flowing from each of the current sources I of the DAC 212, from 0.

As described above, when the reference signal DAOUT is 0, the DAC 211 continuously allows the current to flow, and the current flowing from the DAC 212 is changed to the predetermined value from 0, and thus, the current Idd flowing from the power source 111, the current Idd being identical to the sum of the currents flowing from the DACs 211 and 212, as illustrated in FIG. 12, increases by a predetermined value as the current flowing from the DAC 212.

In addition, in a case where the DAC 212 allows the current to flow, the current Ia which is not 0, flows from the load resistance Ro1 to the load resistance Ro2, and a voltage drop according to the current Ia, occurs. For this reason, the reference signal DAOUT, that is, the voltage of the lower end of the load resistance Ro2, is a voltage which is changed from the voltage of the lower end of the load resistance Ro1, by the voltage drop of the load resistance Ro2.

In the DAC 212 turned on, the decoder 213 controls the switch SW such that the number of switches SW selecting the terminal A from the terminal B increases.

With this arrangement, in the DAC 212, as illustrated in FIG. 12, the current Ia flowing through the terminal A from the load resistance Ro2 increases, and the current Ib flowing through the terminal B from the power source 111 decreases, and thus, the reference signal DAOUT which is the voltage of the lower end of the load resistance Ro2 gradually decreases, as illustrated in FIG. 12.

As described above, the On/Off of the current source I of the DAC 212 is controlled according to the range of the voltage to be output as the reference signal DAOUT, and thus, the DAC used for outputting the reference signal DAOUT is changed, and in the range of DAOUT>0, the DAC 211 connected to the (positive) power source 111 of the positive voltage VDD, is operated, and in the range of DAOUT<0, the DAC 212 connected to the (negative) power source 112 of the negative voltage −VSS, is operated, in addition to the DAC 211, and therefore, it is possible to suppress the power consumption.

That is, (the current source I of) the DAC 211 is turned on, and the DAC 212 is turned off, at the time of outputting the reference signal DAOUT of the positive voltage, and thus, it is possible to suppress the power consumption P at the time of outputting the reference signal DAOUT of the positive voltage, to power represented by an expression of P=Vdd×Idd.

Furthermore, the DAC 212 is turned on at the time of outputting the reference signal DAOUT of the negative voltage, and thus, the power consumption P is power represented by an expression of P=Vdd×Idd+Vss×Iss.

In addition, in FIG. 11, the DAC 211 remains as being turned on, and the DAC 212 is turned on, at the time of outputting the reference signal DAOUT of the negative voltage, and thus, the current Idd flowing from the power source 111, increases by the current Ia+Ib=Iss flowing to the DAC 212, compared to the case of outputting the reference signal DAOUT of the positive voltage. However, the voltage drop occurs in the load resistance Ro1 due to the current flowing from the DAC 211 which remains as being turned on, and thus, in order to generate a necessary reference signal DAOUT, it is possible to decrease the current Ia causing the voltage drop necessary for the load resistance Ro2, and the current flowing from the DAC 212.

Furthermore, the DAC 211 does not remain as being turned on, but is turned off, at the time of outputting the reference signal DAOUT of the negative voltage, and thus, it is possible to allow the current flowing from the DAC 211 to the load resistance Ro1, to flow from the DAC 212 turned on, before the DAC 211 is turned off.

<Fifth Configuration Example of Reference Signal Output Unit 33>

Figure 13:
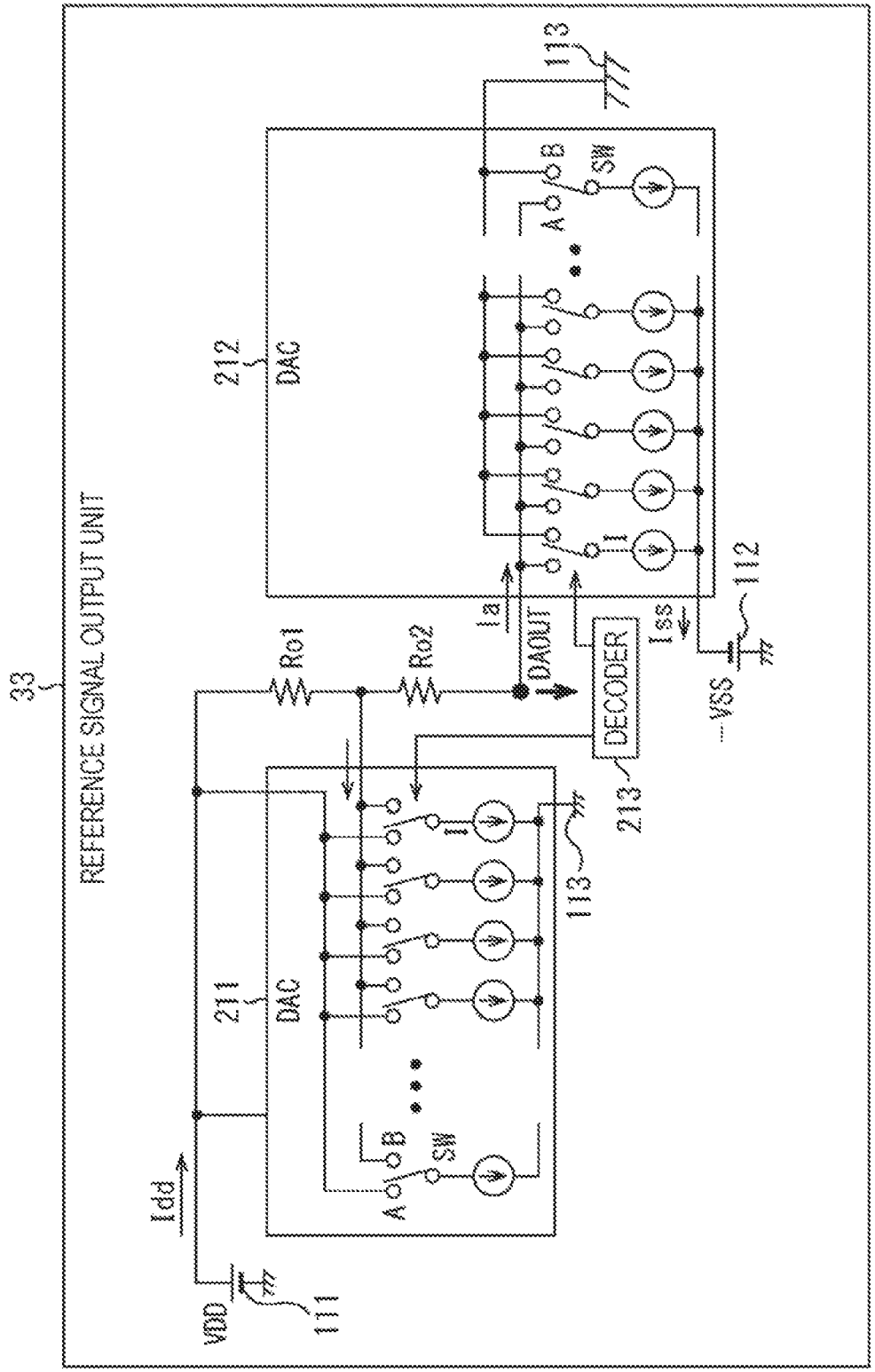
FIG. 13 is a circuit diagram illustrating a fifth configuration example of the reference signal output unit 33.

FIG. 13 is a circuit diagram illustrating a fifth configuration example of the reference signal output unit 33.

Furthermore, in the drawing, the same reference numerals will be applied to portions corresponding to those of FIG. 11, and hereinafter, the description thereof will be suitably omitted.

In FIG. 13, the reference signal output unit 33 includes the DACs 211 and 212, the decoder 213, and the load resistances Ro1 and Ro2.

Therefore, the reference signal output unit 33 of FIG. 13 has a configuration similar to that of the case of FIG. 11.

However, in FIG. 11, the terminal B of the DAC 212 is connected to the power source 111 of the positive voltage, but in FIG. 13, the terminal B of the DAC 212 is connected to the power source 113 which is the GND.

In the DAC 212, the current flowing to the power source 112 from the terminal B through the current source I, is a current to be discarded, the current not contributing to the generation of the reference signal DAOUT, and in FIG. 11, the current of the DAC 212 is discarded to the power source 111 connected to the terminal B of the DAC 212, but in FIG. 13, the current of the DAC 212 is discarded to the GND as the power source 113 connected to the terminal B of the DAC 212.

The operation of the reference signal output unit 33 of FIG. 13 is similar to that of the case of FIG. 11, and thus, the description thereof will be omitted.

<Sixth Configuration Example of Reference Signal Output Unit 33>

Figure 14:
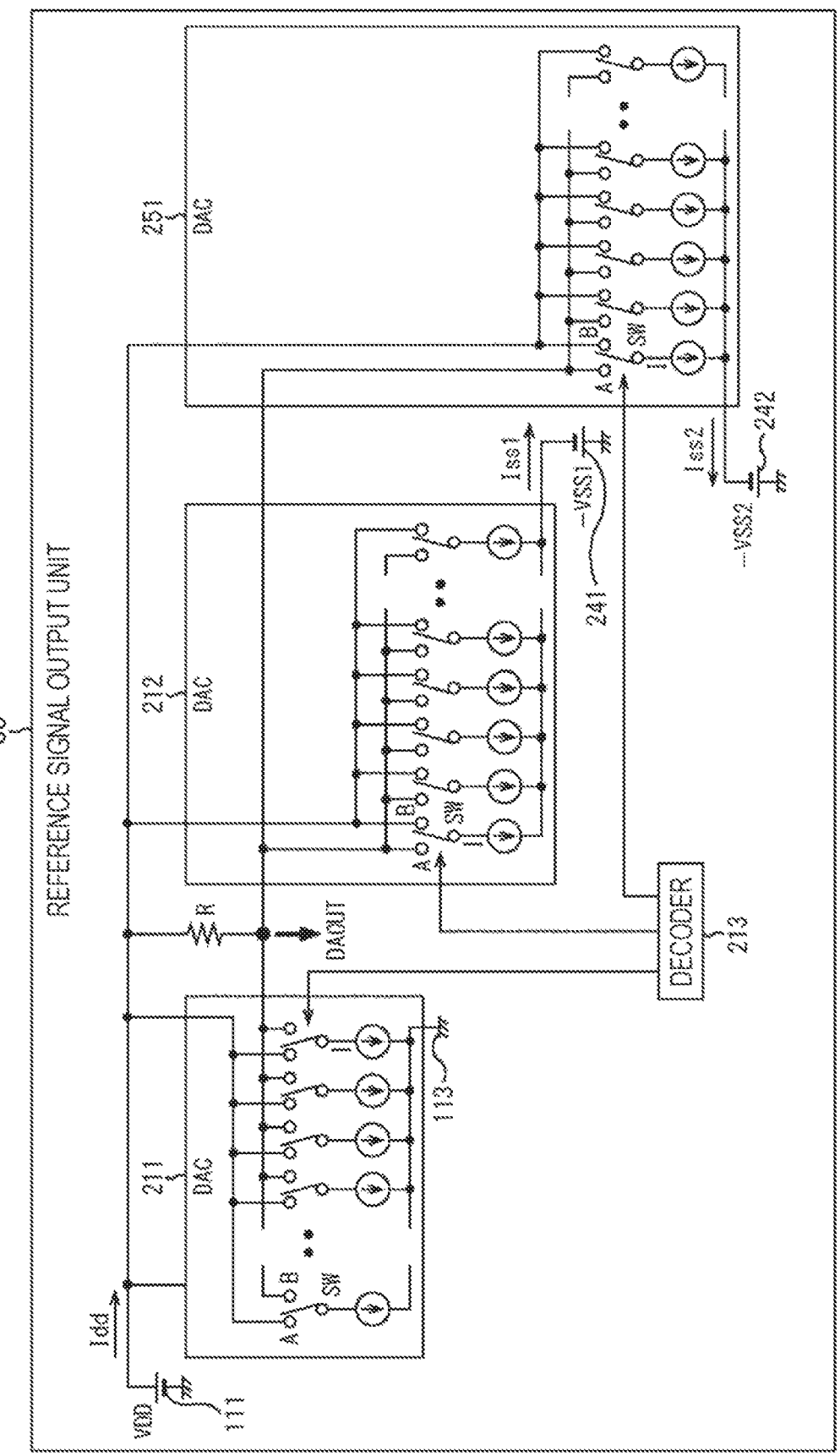
FIG. 14 is a circuit diagram illustrating a sixth configuration example of the reference signal output unit 33.

FIG. 14 is a circuit diagram illustrating a sixth configuration example of the reference signal output unit 33.

Furthermore, in the drawing, the same reference numerals will be applied to portions corresponding to those in the case of FIG. 4, and hereinafter, the description thereof will be suitably omitted.

In FIG. 14, the reference signal output unit 33 includes the DACs 211 and 212, the decoder 213, a DAC 251, and the load resistance R.

Therefore, the reference signal output unit 33 of FIG. 14 is common to the case of FIG. 4, in that the DACs 211 and 212, the decoder 213, and the load resistance R are provided, and is different from the case of FIG. 4, in that the DAC 251 is newly provided.

In FIG. 14, the reference signal output unit 33 is connected to the power source 111 of the positive voltage VDD, the power source 113 which is the GND, a power source 241 of a negative voltage −VSS1, and a power source 242 of a negative voltage −VSS2 less than the negative voltage −VSS1 (0<VSS1<VSS2). The DAC 211 is connected to the power sources 111 and 113, and the DAC 212 is connected to the power sources 111 and 241. The DAC 251 is connected to the power sources 111 and 242.

Furthermore, the power source 241 of the negative voltage −VSS1 corresponds to the power source 112 of the negative voltage VSS of FIG. 4.

Therefore, the reference signal output unit 33 of FIG. 14 has a configuration similar to that of the case of FIG. 4, except that the DAC 251 connected to the power sources 111 and 242, is newly provided, and the reference signal output unit 33 is connected to the power source 242.

The DAC 251 has a configuration similar to that of the DAC 211 or 212.

That is, the DAC 251 includes the plurality of current sources I, and the plurality of switches SW of the same number as the number of current sources I, the switches SW controlling the current I flowing from each of the current sources I. In the DAC 251, the number of current sources I may be the same as or different from that of the case of DAC 211 or 212.

In the DAC 251, one end of the current source I is connected to the power source 242, and the other end of the current source I is connected to the switch SW.

In the DAC 251, the switch SW selects the left terminal A or the right terminal B according to the control of the decoder 213, and with this arrangement, controls the current I flowing from the current source I connected to the switch SW.

In the DAC 251, the terminal A is connected to the lower end of the load resistance R, and the terminal B is connected to the power source 111.

Furthermore, in FIG. 14, the decoder 213 controls the selection of the terminal A or B of the switch SW, with respect to the DAC 251, in addition to the DACs 211 and 212, according to the control of the control unit 20 (FIG. 2).

A combination of the power sources 111 and 242 connected to the DAC 251, includes a path extending from power source 111 to the power source 242 through the terminal B and the current source I of the DAC 251, and a path extending from the power source 111 to the power source 242 through the load resistance R, and the terminal A and the current source I of the DAC 251, as the first path through which the current controlled by the switch SW of the DAC 251, flows.

Further, a combination of the power sources 111 and 242, includes a path extending from the power source 111 to the power source 242 through the load resistance R, and the terminal A and the current source I of the DAC 251, as the second path through which the current in the same direction, flows to the load resistance R.

Then, the DAC 251 exists on the first path and the second path of the combination of the power sources 111 and 242 connected to the DAC 251.

In the reference signal output unit 33 configured as described above, for example, the reference signal DAOUT of the voltage in the range from positive voltage VDD to 0 V, is output by using the DAC 211 as the valid DAC, in the DACs 211, 212, and 251, and the reference signal DAOUT of a voltage in a range from 0 V to the negative voltage −VSS1, is output by using the DAC 212 as the valid DAC. Then, the reference signal DAOUT of a voltage in a range from the negative voltage −VSS1 to the negative voltage −VSS2, is output by using the DAC 251 as the valid DAC.

Figure 15:
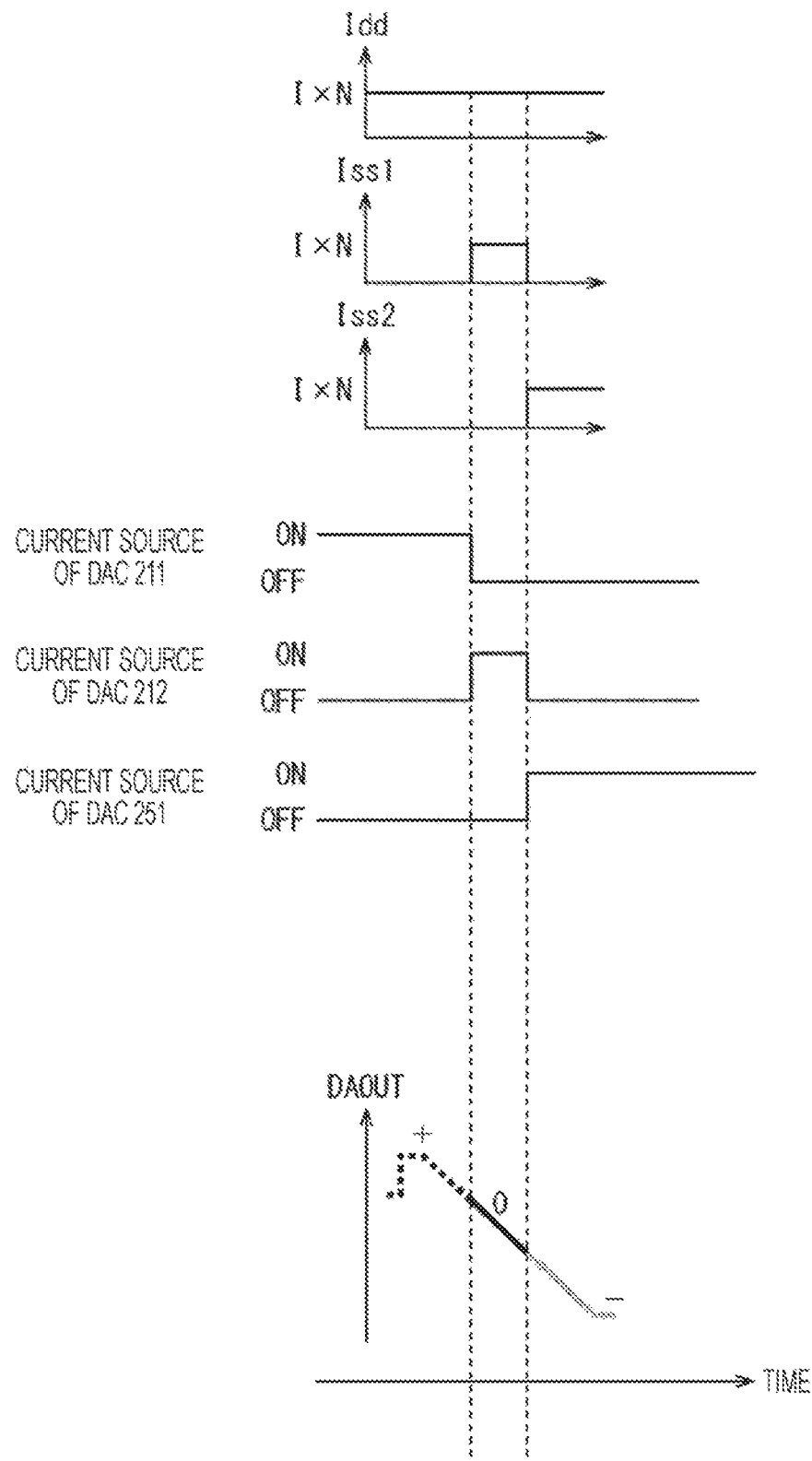
FIG. 15 is a timing chart describing an example of the operation of the sixth configuration example of the reference signal output unit 33.

FIG. 15 is a timing chart describing an example of the operation of the reference signal output unit 33 of FIG. 14.

That is, FIG. 15 illustrates an example of the current Idd flowing through the power source 111, a current Iss1 flowing through the power source 241, a current Iss2 flowing through the power source 242, the On/Off state of the current source I of the DACs 211, 212, and 251, and the reference signal DAOUT.

Furthermore, here, for the sake of simple description, the number of current sources I of each of the DACs 211, 212, and 251, are all N. In this case, the currents flowing from each of the DACs 211, 212, and 251, are all a constant current of I×N.

In the output of the reference signal DAOUT which is changed from the positive voltage to the negative voltage, in order to output the reference signal DAOUT of the voltage in the range from the positive voltage VDD to 0 V, as illustrated in FIG. 15, the current source I of the DAC 211 is controlled such that the current source I is turned on, and the current source I of the DACs 212 and 251 is controlled such that the current source I is turned off.

In the DAC 211 (of which the current source I is) turned on, the decoder 213 controls the switch SW such that the number of switches SW selecting the terminal B from the terminal A increases, and with this arrangement, the reference signal DAOUT gradually decreases, as illustrated in FIG. 15.

The current Idd flowing through the power source 111, is the constant current I×N flowing from (all of the current sources I of) the DAC 211, while the reference signal DAOUT of the positive voltage is output.

In addition, the current source I of the DACs 212 and 251 is turned off while the reference signal DAOUT of the positive voltage is output, and thus, the current flowing from the DACs 212 and 251 is 0, and the current Iss1 flowing to the power source 241 connected to the DAC 212, and the current Iss2 flowing to the power source 242 connected to the DAC 251, are also 0.

After that, in a case where the reference signal DAOUT is 0 V which is the minimum voltage that can be output by using DAC 211 (and not using the DACs 212 and 251), in the subsequent output of the reference signal DAOUT of the negative voltage, as illustrated in FIG. 15, the current source I of the DAC 211 is controlled such that the current source I is turned off, and the current source I of the DAC 212 is controlled such that the current source I is turned on. Furthermore, the current source I of the DAC 251 remains as being turned off.

The current source I of the DAC 211 is turned off, and thus, the current does not flow to the DAC 211, but the current source I of the DAC 212 is turned on, and thus, the current flowing from the DAC 212 is changed to I×N from 0.

The current flowing from the DAC 212, is identical to the current I×N flowing from the DAC 211 before being turned off, and the current Iss1 flowing to the power source 241 connected to the DAC 212, is the current I×N flowing from the DAC 212, as illustrated in FIG. 15.

In addition, the current flowing from the DAC 211 is changed to 0 from I×N, the current flowing from the DAC 212 is changed to I×N from 0, and the current flowing from the DAC 251 remains as 0, and thus, the current Idd flowing through the power source 111 remains as I×N, as illustrated in FIG. 15.

In the DAC 212 turned on, the decoder 213 controls the switch SW such that the number of switches SW selecting the terminal A from the terminal B increases, and with this arrangement, the reference signal DAOUT gradually decreases, as illustrated in FIG. 15.

After that, in a case where the reference signal DAOUT is the minimum voltage −VSS1, the minimum voltage being capable of being output by using the DAC 212 (and not using the DACs 211 and 251), in the subsequent output of the reference signal DAOUT of the negative voltage, as illustrated in FIG. 15, the current source I of the DAC 212 is controlled such that the current source I is turned off, and the current source I of the DAC 251 is controlled such that the current source I is turned on. Furthermore, the current source I of the DAC 211 remains as being turned off.

The current source I of the DAC 212 is turned off, and thus, the current does not flow to the DAC 212, but the current source I of the DAC 251 is turned on, and thus, the current flowing from the DAC 251 is changed to I×N from 0.

The current flowing from the DAC 251, is identical to the current I×N flowing from the DAC 212 before being turned off, and the current Iss2 flowing to the power source 242 connected to the DAC 251, is the current I×N flowing from the DAC 212, as illustrated in FIG. 15.

In addition, the current flowing from the DAC 212 is changed to 0 from I×N, the current flowing from the DAC 251 is changed to I×N from 0, and the current flowing from the DAC 211 remains as 0, and thus, the current Idd flowing through the power source 111 remains as I×N, as illustrated in FIG. 15.

In the DAC 251 turned on, the decoder 213 controls the switch SW such that the number of switches SW selecting the terminal A from the terminal B, increases, and with this arrangement, the reference signal DAOUT gradually decreases, as illustrated in FIG. 15.

As described above, the valid DAC used for outputting the reference signal DAOUT, is changed by controlling the On/Off of the current source I of the DACs 211, 212, and 251 according to the range of the voltage to be output as the reference signal DAOUT, and thus, it is possible to suppress the power consumption, similarly to the case of FIG. 4.

That is, in FIG. 14, it is possible to output the reference signal DAOUT of the voltage in the range from the positive voltage VDD to the negative voltage −VSS2, by using only the DAC 251, but in such a case, the power consumption P is normally P=VDD×Idd+VSS2×Iss2.

On the other hand, the power consumption P in the case of using only the DAC 211 as the valid DAC in order to output the reference signal DAOUT of the voltage in the range from the positive voltage VDD to 0 V, is P=VDD×Idd. In addition, the power consumption in the case of using only the DAC 212 as the valid DAC in order to output the reference signal DAOUT of the voltage in the range from 0 V to the negative voltage −VSS1, is P=VDD×Idd+VSS1×Iss1. Further, the power consumption in the case of using only the DAC 251 as the valid DAC in order to output the reference signal DAOUT of the voltage in the range from the negative voltage −VSS1 to the negative voltage −VSS2, is P=VDD×Idd+VSS2×Iss2.

Therefore, in the case of using only the DAC 211 as the valid DAC, it is possible to decrease the power consumption P to P=VDD×Idd (<VDD×Idd+VSS2×Iss2). Further, in the case of using only the DAC 212 as the valid DAC, it is possible to decrease the power consumption to P=VDD×Idd+VSS1×Iss1 (<VDD×Idd+VSS2×Iss2).

<Usage Example of Image Sensor>

Figure 16:
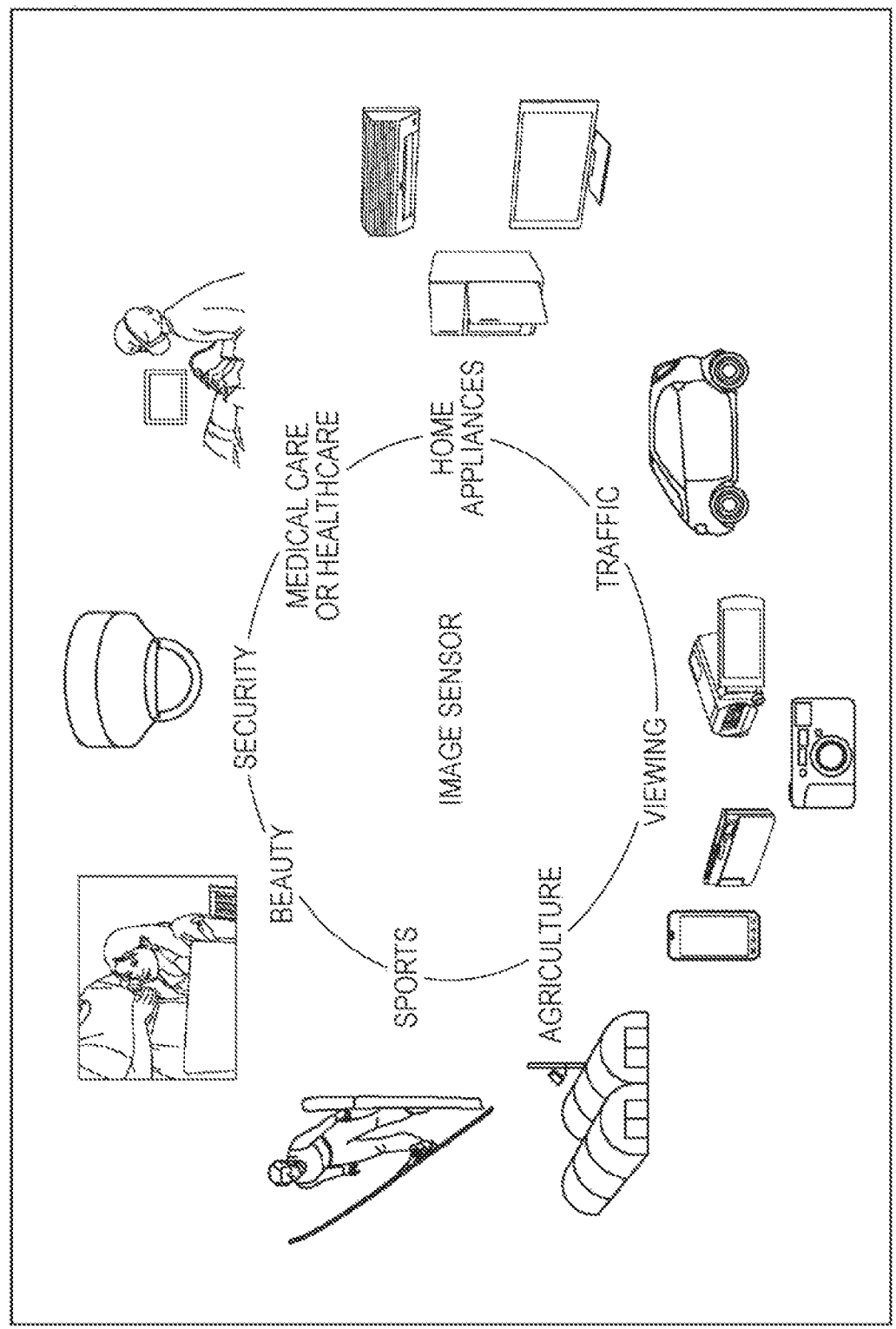
FIG. 16 is a diagram illustrating a usage example of using the image sensor 2.

FIG. 16 is a diagram illustrating a usage example of using the image sensor 2 of FIG. 1.

The image sensor 2, for example, can be used for various electronic devices sensing light such as visible light, infrared light, ultraviolet light, and an X ray, as described below.

An electronic device capturing an image provided for viewing, such as a digital camera or a mobile device with a camera function An electronic device used for traffic in order for safe driving such as automatic stop, recognition of the condition of a driver, or the like, such as a vehicle sensor for capturing the front, the back, the periphery, and the inside of the automobile, a monitor camera for monitoring a traveling vehicle or a road, and a distance measuring sensor for measuring a distance between vehicles An electronic device used for home appliances in order to capture a gesture of a user and to manipulate a device according to the gesture, such as a TV, a refrigerator, and an air conditioner An electronic device used for medical care or healthcare, such as an endoscope, an electron microscope, and an device for performing angiography by receiving infrared light An electronic device used for security, such as a surveillance camera for crime prevention, and a camera for authenticating a person An electronic device used for beauty, such as a skin measuring device for capturing the skin, a microscope for capturing the scalp An electronic device used for sports, such as an action camera or a wearable camera for sports or the like An electronic device used for agriculture, such as a camera for monitoring the condition of fields or crops Furthermore, the embodiment of the present technology is not limited to the embodiments described above, and various modifications can be performed within a range not departing from the gist of the present technology.

For example, the present technology can be applied to an image sensor sensing an infrared ray, and an electromagnetic wave other than a visible light ray, in addition to an image sensor sensing a visible light ray.

Further, the present technology can be applied to an electric signal other than the electric signal output by the pixel of the image sensor, that is, for example, a microphone sensing a sound, and AD conversion of an analog electric signal output by other sensors sensing an arbitrary physical amount.

In addition, the present technology can be applied to AD conversion of an arbitrary analog signal, in addition to the electric signal output by the sensor.

Here, the effects described herein are merely an example and are not limited, and may be other effects.

Furthermore, the present technology is capable of having the following configurations.

<1>
An image sensor, including:
a pixel configured to output an electric signal, by including a photoelectric conversion element performing photoelectric conversion;
a reference signal output unit configured to output a reference signal of which a level is changed; and
an analog to digital (AD) conversion unit configured to perform AD conversion of the electric signal by comparing the electric signal output from the pixel, with the reference signal, and by using a comparison result between the electric signal and the reference signal,
in which the reference signal output unit includes,
a plurality of DACs including a plurality of current sources, and a plurality of switches controlling a current flowing from the current source, and
a load resistance configured to output the reference signal according to the flow of the current,
the reference signal output unit is connected to three or more power sources, and
in combinations of two power sources in the three or more power sources, each of two or more types of combinations of the power sources includes a first path through which the current controlled by the switch, flows, and a second path through which a current in the same direction, flows to the load resistance.

<2>
The image sensor according to <1>,
in which the path of the current flowing to the load resistance is changed by controlling On/Off of the current source.

<3>
The image sensor according to <2>,
in which the DAC allowing the current to flow to the load resistance, is changed by controlling the On/Off of the current source according to a range of a voltage to be output as the reference signal.

<4>
The image sensor according to <1>,
in which the DAC,
allows a current directed from one power source towards the other power source of the combination of the power sources, to flow, on the first path and the second path,
outputs the reference signal of a voltage of a predetermined range, by controlling the current flowing to the load resistance with the switch, and
changes the DAC used for outputting the reference signal, according to the range of the voltage to be output as the reference signal.

<5>
The image sensor according to any of <1> to <4>,
in which one power source of the three or more power sources, is a ground.

<6>
The image sensor according to any of <1> to <5>,
in which the three or more power sources include a power source of a positive voltage, and a power source of a negative voltage.

<7>
An electronic device, including:
an optical system configured to condense light; and
an image sensor configured to receive light, and to output a signal corresponding to an amount of the received light,
in which the image sensor includes,
a pixel configured to output an electric signal, by including a photoelectric conversion element performing photoelectric conversion,
a reference signal output unit configured to output a reference signal of which a level is changed, and
an analog to digital (AD) conversion unit configured to perform AD conversion of the electric signal by comparing the electric signal output from the pixel, with the reference signal, and by using a comparison result between the electric signal and the reference signal,
the reference signal output unit includes,
a plurality of DACs including a plurality of current sources, and a plurality of switches controlling a current flowing from the current source, and
a load resistance configured to output the reference signal according to the flow of the current,
the reference signal output unit is connected to three or more power sources, and
in combinations of two power sources in the three or more power sources, each of two or more types of combinations of the power sources includes a first path through which the current controlled by the switch, flows, and a second path through which a current in the same direction, flows to the load resistance.

REFERENCE SIGNS LIST

1 Optical system
2 Image sensor
3 Memory
4 Signal processing unit
5 Output unit
6 Control unit
10 Pixel array
$11_{1,1}$ to $11_{M,N}$ Pixel
20 Control unit
22 Pixel driving unit
Column parallel AD conversion device
$31_1$ to $31_N$ ADC
32 Automatic zero control unit
32A Automatic zero control line
33 Reference signal output unit
33A Reference signal line
34 Clock output unit
34A Clock line
$41_1$ to $41_m$ Pixel control line
$42_1$ to $42_N$ VSL
$43_1$ to $43_N$ Current source
111 to 113 Power source
121, 122, 211, 212 DAC
213 Decoder
221, 222, 231, 232 DAC 241, 242 Power source
251 DAC

The invention claimed is:

1. An image sensor, comprising:
a pixel configured to output an electric signal, wherein
the pixel includes a photoelectric conversion element configured to perform photoelectric conversion;
circuitry configured to output a reference signal of which a level is changed; and
an analog to digital (AD) conversion unit configured to:
compare the electric signal output from the pixel with the reference signal; and
perform AD conversion of the electric signal based on a comparison result of the comparison between the electric signal and the reference signal, wherein
the circuitry includes:
a plurality of digital to analog converters (DACs) including:
a plurality of current sources; and
a plurality of switches configured to control a current flowing from the plurality of current sources; and
a load resistance configured to output the reference signal based on a flow of the current,
the circuitry is connected to three or more power sources,
a combination of power sources includes two power sources of the three or more power sources, and
each combination of two or more types of combinations of the two power sources includes:
a first path through which the current controlled by the plurality of switches flows; and
a second path through which the current in a same direction flows to the load resistance.

2. The image sensor according to claim 1, wherein a path of the current flowing to the load resistance is configured to be changed based on a control of On/Off of the plurality of current sources.

3. The image sensor according to claim 2, wherein
a DAC of the plurality of DACs is configured to allow the current to flow to the load resistance is changed based on the control of the On/Off of the plurality of current sources, and
the On/Off of the plurality of current sources is controlled based on a range of a voltage to be output as the reference signal.

4. The image sensor according to claim 1, wherein a DAC of the plurality of DACs is configured to:
allow the current directed from a first power source of the combination of powers sources towards a second power source of the combination of the power sources to flow on the first path and the second path;
output the reference signal of a voltage of a determined range based on control of the current flowing to the load resistance with the plurality of switches; and
change the DAC configured to output the reference signal based on the determined range of the voltage to be output as the reference signal.

5. The image sensor according to claim 1, wherein a power source of the three or more power sources is a ground.

6. The image sensor according to claim 1, wherein the three or more power sources include:
a power source of a positive voltage; and
a power source of a negative voltage.

7. An electronic device, comprising:
an optical system configured to condense light;
an image sensor configured to:
receive the light; and
output a signal corresponding to an amount of the received light, wherein the image sensor includes:
a pixel configured to output an electric signal, wherein
the pixel includes a photoelectric conversion element configured to perform photoelectric conversion;
circuitry configured to output a reference signal of which a level is changed; and
an analog to digital (AD) conversion unit configured to:
compare the electric signal output from the pixel with the reference signal; and
perform AD conversion of the electric signal based on a comparison result of the comparison between the electric signal and the reference signal, wherein
the circuitry includes:
a plurality of digital to analog converters (DACs) including:
a plurality of current sources; and
a plurality of switches configured to control a current flowing from the plurality of current sources; and
a load resistance configured to output the reference signal based on a flow of the current,
the circuitry is connected to three or more power sources,
a combination of power sources includes two power sources of the three or more power sources, and
each combination of two or more types of combinations of two the power sources includes:
a first path through which the current controlled by the plurality of switches flows; and
a second path through which the current in a same direction flows to the load resistance.

* * * * *